US012785663B2

(12) United States Patent
Tsai et al.

(10) Patent No.: US 12,785,663 B2
(45) **Date of Patent: *Nov. 3, 2026**

(54) IMPEDANCE CALIBRATION CIRCUIT AND METHOD

(71) Applicant: M31 TECHNOLOGY CORPORATION, Hsinchu County (TW)

(72) Inventors: Ming-Yen Tsai, Hsinchu County (TW); Tze-Hsiang Chao, Hsinchu County (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 15 days.

This patent is subject to a terminal disclaimer.

(21) Appl. No.: 18/985,370

(22) Filed: Dec. 18, 2024

(65) Prior Publication Data

US 2025/0119121 A1 Apr. 10, 2025

Related U.S. Application Data

(63) Continuation of application No. 18/182,172, filed on Mar. 10, 2023, now Pat. No. 12,244,282.

(51) Int. Cl.
*H03H 11/28* (2006.01)
*G11C 7/10* (2006.01)
*H03K 5/24* (2006.01)

(52) U.S. Cl.
CPC ........... *H03H 11/28* (2013.01); *G11C 7/1048* (2013.01); *H03K 5/24* (2013.01); *G11C 2207/2254* (2013.01)

(58) Field of Classification Search
CPC .... H03H 11/28; G11C 7/1048; G11C 29/028; G11C 29/022; G11C 29/50008; H03K 5/24
See application file for complete search history.

(56) References Cited

U.S. PATENT DOCUMENTS 6,541,997 B1 * 4/2003 Goodnow .......... H03K 19/0005 326/87
9,531,382 B1 12/2016 Miwa et al.
(Continued)

FOREIGN PATENT DOCUMENTS

CN 112636717 A 4/2021
WO 2015149283 A1 10/2015

OTHER PUBLICATIONS

Office Action issued by TIPO dated Aug. 29, 2025 for TW 114128189.
(Continued)

*Primary Examiner* — Sibin Chen
(74) *Attorney, Agent, or Firm* — WPAT, P.C.; Anthony King

(57) ABSTRACT

An impedance calibration circuit includes a variable impedance circuit, a detection circuit and a control circuit. The variable impedance circuit includes conduction paths connected in parallel between an output terminal and a supply terminal coupled to a first supply voltage. The variable impedance circuit is configured to adjust an impedance at the output terminal by enabling one or more of the conduction paths according to a calibration code. The detection circuit is configured to detect a change in impedance of the conduction paths by applying a second supply voltage to a reference terminal through a detection path, and accordingly generate an input voltage at the reference terminal. An electric potential of the second supply voltage is equal to an electric potential of the first supply voltage. The control circuit is configured to compare the input voltage with reference voltages to generate the calibration code.

20 Claims, 14 Drawing Sheets

(56) References Cited

U.S. PATENT DOCUMENTS

| | | | |
|---|---|---|---|
| 11,367,471 | B2 | 6/2022 | Kavala et al. |
| 2008/0100333 | A1 | 5/2008 | Kim et al. |
| 2016/0365855 | A1 | 12/2016 | Baek et al. |
| 2020/0252057 | A1* | 8/2020 | Guo ..................... H03K 5/1252 |
| 2021/0242870 | A1 | 8/2021 | Kim et al. |
| 2023/0370050 | A1* | 11/2023 | Wen ..................... G11C 29/028 |
| 2024/0014816 | A1* | 1/2024 | Choi .............. H03K 19/018585 |

OTHER PUBLICATIONS

English Summary of the Office Action issued by TIPO dated Aug. 29, 2025 for TW 114128189.
Office Action issued by TIPO dated Jan. 9, 2025 for TW 113105820.
English Summary of the Office Action issued by TIPO dated Jan. 9, 2025 for TW 113105820.
English Abstract of CN112636717A.

* cited by examiner

IMPEDANCE CALIBRATION CIRCUIT AND METHOD

PRIORITY CLAIM AND CROSS-REFERENCE

The present application is a continuation application of U.S. patent application Ser. No. 18/182,172 filed on Mar. 10, 2023, which is incorporated by reference herein in its entirety.

BACKGROUND

The present disclosure relates to impedance calibration and, more particularly, to an impedance calibration circuit for high resolution ZQ calibration, and an impedance calibration method.

The signal integrity of a high-speed memory channel has become one of the most critical concerns. For example, impedance mismatches between a memory controller and a memory device will cause signal reflection during transmission along a memory channel. As higher-frequency signals are more sensitive to impedance discontinuity, signal-integrity problems tend to proliferate in high-speed memory devices. To reduce signal distortion caused by impedance mismatches, a memory device may include an on-die termination (ODT) circuit or an off-chip driver (OCD) circuit. However, variations across process, voltage and temperature (PVT) can significantly affect the impedance of the ODT/OCD circuit. Thus, there is a need in the art for an improved design to reduce the adverse effects resulting from the PVT variations.

SUMMARY

The described embodiments provide an impedance calibration circuit for high resolution ZQ calibration, and an impedance calibration method.

Some embodiments described herein may include an impedance calibration circuit. The impedance calibration circuit includes a variable impedance circuit, a detection circuit and a control circuit. The variable impedance circuit includes a plurality of conduction paths connected in parallel between a supply terminal and an output terminal. The supply terminal is coupled to a first supply voltage. The variable impedance circuit is configured to adjust an impedance at the output terminal by enabling one or more of the conduction paths according to a calibration code. The detection circuit is configured to detect a change in impedance of the conduction paths by applying a second supply voltage to a reference terminal through a detection path of the detection circuit, and accordingly generate an input voltage at the reference terminal. An electric potential of the second supply voltage is equal to an electric potential of the first supply voltage. The control circuit, coupled to the variable impedance circuit and the detection circuit, is configured to compare the input voltage with a plurality of reference voltages to generate the calibration code.

Some embodiments described herein may include an impedance calibration circuit. The impedance calibration circuit includes a variable impedance circuit, a detection circuit, a first comparator and a signal generator circuit. The variable impedance circuit includes a plurality of conduction paths connected in parallel. Each of the conduction paths is coupled to an output terminal. The variable impedance circuit is configured to adjust an impedance at the output terminal by enabling one or more of the conduction paths according to a calibration code. The detection circuit is configured to detect a change in impedance of the conduction paths to generate an input voltage. The first comparator, coupled to the variable impedance circuit and the detection circuit, is configured to compare the input voltage with a predetermined reference voltage to generate a first comparison result. The first comparison result serves as a first portion of the calibration code. The signal generator circuit, coupled to the variable impedance circuit, the detection circuit and the first comparator, is configured to compare the input voltage with one set of reference voltages selected from among a first set of reference voltages and a second set of reference voltages according to the first comparison result, and accordingly generate a second portion of the calibration code. The first set of reference voltages is different from the second set of reference voltages.

Some embodiments described herein may include an impedance calibration method. The impedance calibration method includes: detecting a change in impedance of a plurality of conduction paths connected in parallel by applying a first supply voltage to an reference terminal through a detection path, and accordingly generating an input voltage at the reference terminal, wherein the conduction paths are connected in parallel between a supply terminal and an output terminal of a variable impedance circuit, the supply terminal is coupled to a second supply voltage, and an electric potential of the first supply voltage is equal to an electric potential of the second supply voltage; comparing the input voltage with a plurality of reference voltages to generate a calibration code; and adjusting an impedance at the output terminal by enabling one or more of the conduction paths according to the calibration code.

With the use of a detection circuit capable of tracking impedance characteristics affected by PVT variations, the proposed impedance calibration circuit can realize an open loop calibration mechanism, and achieve a simplified structure and faster response. In addition, the proposed impedance calibration circuit can compare a voltage indicative of impedance variations with a selected set of reference voltages and accordingly enable/disable one or more conduction paths having different impedances, thereby realizing adaptive impedance compensation with high precision.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
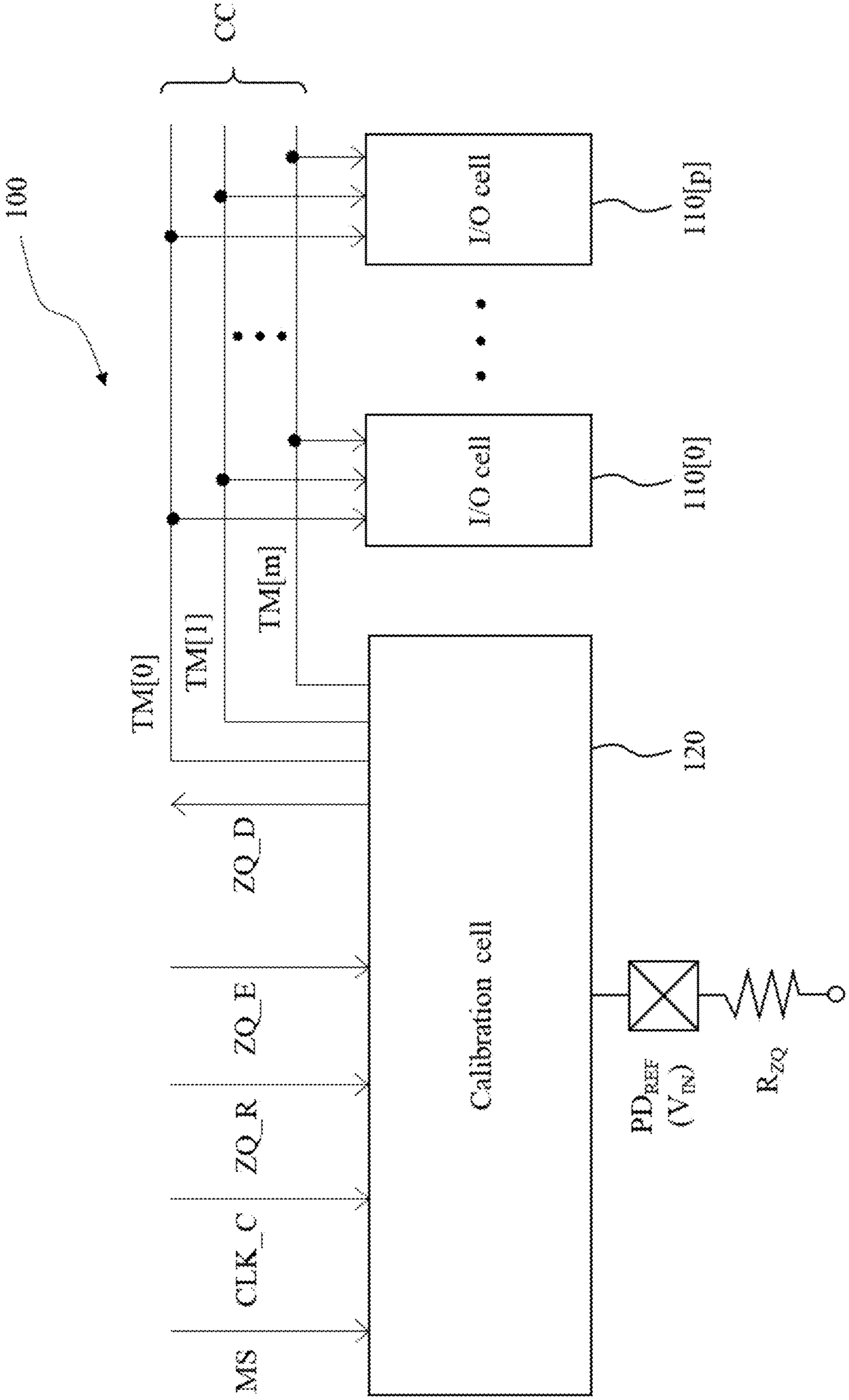
FIG. 1 is a block diagram illustrating an exemplary impedance calibration circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, parameter values in the description that follows may vary depending on a given technology node. As another example, parameter values for a given technology node may vary depending on a given application or operating scenario. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

In order to compensate for impedance changes caused by PVT variations, a calibration circuit may perform ZQ calibration upon an impedance of an output driver with the use of an external resistor connected to a ZQ pad. The calibration circuit usually utilizes a closed loop calibration mechanism, in which an output of the output driver is fed back for determining an impedance control code. However, the calibration circuit with closed loop control has a complicated structure and exhibits a slower response.

The present disclosure describes exemplary impedance calibration circuits, each of which can adjust an impedance at an output terminal to fall within a tolerance range of a predetermined impedance value based on the detection of PVT variations. The exemplary impedance calibration circuit can utilize a detection path to track impedance characteristics of one or more conduction paths connected to the output terminal. The impedance characteristics of the one or more conduction paths are affected by PVT variations. For example, the detection path used for tracking the impedance characteristics can be connected to an impedance element that may not be subjected to PVT variations. By applying a supply voltage to the impedance element through the detection path, the exemplary impedance calibration circuit can generate a voltage that is indicative of the effect of PVT variations on the impedance characteristics of the one or more conduction paths. In addition, the exemplary impedance calibration circuit can compare the voltage with a plurality of reference voltages to determine the amount of impedance adjustment, which is used to compensate for impedance changes caused by PVT variations. The proposed impedance compensation scheme can be applied to an impedance calibration circuit employing open loop control or closed loop control. Further description is provided below.

FIG. 1 is a block diagram illustrating an exemplary impedance calibration circuit in accordance with some embodiments of the present disclosure. The impedance calibration circuit 100 can be employed in memory interfaces for realizing impedance matching between a memory controller and a memory device. The memory interfaces may include, but are not limited to, high speed memory interfaces such as an Open NAND Flash Interface (ONFI). In the present embodiment, the impedance calibration circuit 100 can utilize open loop control to perform high resolution ZQ calibration.

The impedance calibration circuit 100 includes, but is not limited to, a plurality of input/output (I/O) cells 110[0]-110[p] and a calibration cell 120, where p is a positive integer. Each I/O cell may be regarded as a variable impedance circuit, which is configured to adjust an impedance thereof according to a calibration code CC. For example, when the I/O cells 110[0]-110[p] operate at a transmitter side, each I/O cell can be configured to adjust an output impedance thereof according to the calibration code CC. As another example, when the I/O cells 110[0]-110[p] operate at a receiver side, each I/O cell can be configured to adjust an input impedance thereof according to the calibration code CC. In the present embodiment, the calibration code CC can be implemented using an (m+1)-bit digital code including trim bits TM[0]-TM[m], where m is a positive integer. One or more conduction paths within each I/O cell can be enabled/disabled according to the trim bits TM[0]-TM[m].

The calibration cell 120, also referred to as a ZQ cell, is configured to provide the calibration code CC by detecting the effect of PVT variations on impedance characteristics of the I/O cells 110[0]-110[p]. In the present embodiment, the calibration cell 120 is coupled to a reference terminal (or a reference pad) $PD_{REF}$, which can be connected to an impedance element $R_{ZQ}$ such as an external impedance element. The impedance element $R_{ZQ}$ is coupled to a node NR which may have a reference potential. The impedance element $R_{ZQ}$ can be a high precision resistor, or a resistor located outside the impedance calibration circuit 100. For example, the impedance elements of the I/O cells 110[0]-110[p] can be on-chip resistors, while the impedance element $R_{ZQ}$ can be an off-chip resistor. With the use of the impedance element $R_{ZQ}$, the calibration cell 120 can generate an input voltage $V_{IN}$ at the reference terminal $PD_{REF}$ in response to the detection of PVT variations. The input voltage $V_{IN}$ can be indicative of the effect of PVT variations on the impedance characteristics of the I/O cells 110[0]-110[p]. The calibration cell 120 can generate the calibration code CC according to the input voltage $V_{IN}$.

In operation, the calibration cell 120 can be clocked by a clock signal CLK_C to perform ZQ calibration. The calibration cell 120 can enter a calibration mode in response to a mode selection signal MS. In the calibration mode, the calibration cell 120 can be reset when a reset signal ZQ_R is asserted. For example, a code value of the calibration code CC can be reset in response to the reset signal ZQ_R. Next, when an enable signal ZQ_E is asserted, the calibration cell 120 can detect the effect of PVT variations on impedance characteristics of the I/O cells 110[0]-110[p], thereby generating the input voltage $V_{IN}$. The calibration cell 120 can update the code value of the calibration code CC according to the input voltage $V_{IN}$. After a period of time, the calibration cell 120 can issue an output signal ZQ_D to indicate that the ZQ calibration is done. Each of the I/O cells 110[0]-110[p] can adjust an impedance thereof according to the calibration code CC outputted from the calibration cell 120.

For illustrative purposes, the proposed impedance calibration scheme is described below with reference to a single I/O cell. Those skilled in the art should appreciate that the proposed impedance calibration scheme described below can be applied to an impedance calibration circuit having multiple I/O cells without departing from the scope of the present disclosure.

Figure 2A:
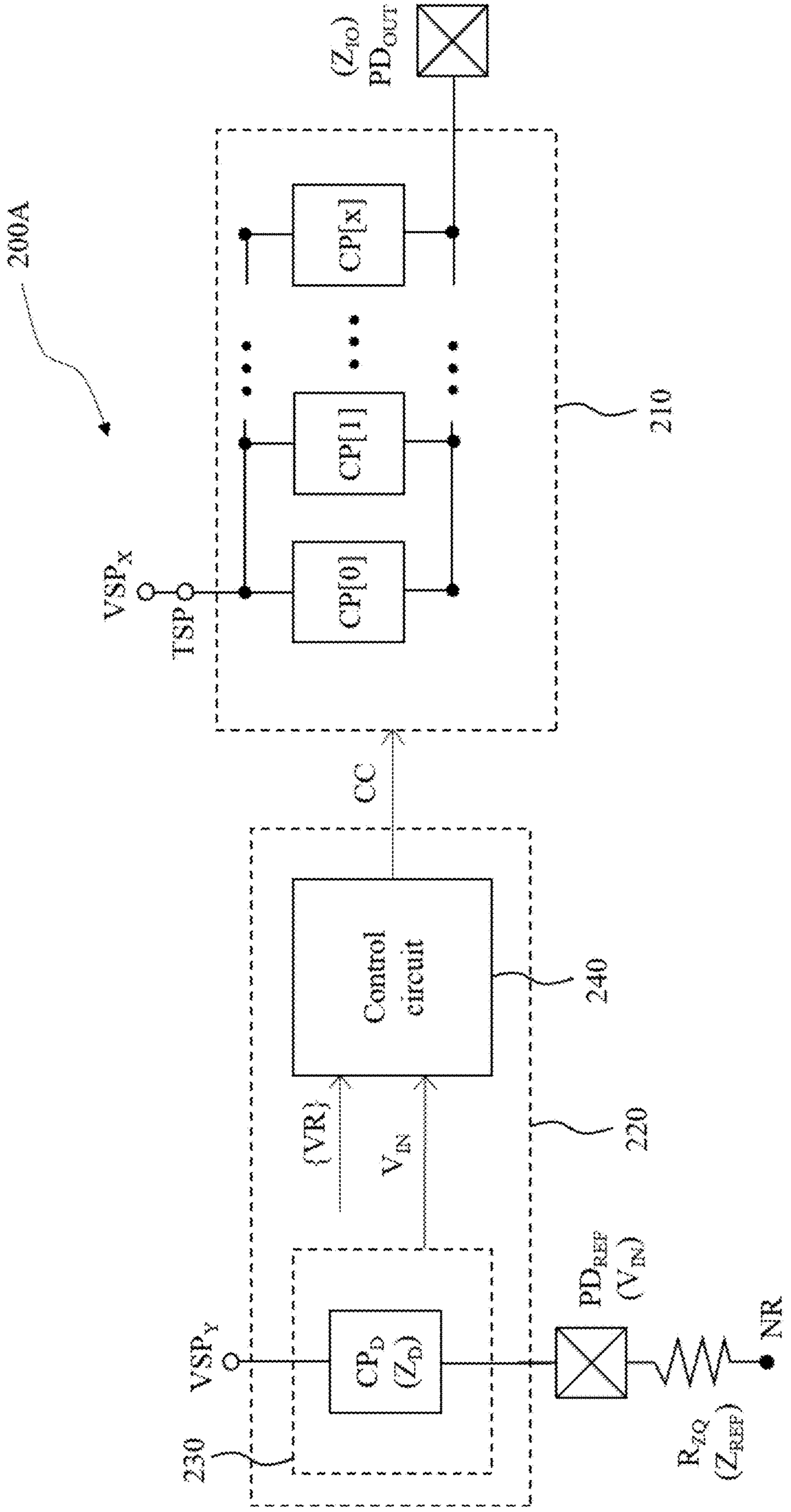
FIG. 2A illustrates an implementation of the impedance calibration circuit shown in FIG. 1 in accordance with some embodiments of the present disclosure.

FIG. 2A illustrates an implementation of the impedance calibration circuit 100 shown in FIG. 1 in accordance with some embodiments of the present disclosure. The impedance calibration circuit 200A includes, but is not limited to, a variable impedance circuit 210 and a calibration cell 220. The variable impedance circuit 210 can serve as an embodiment of one of the I/O cells 110[0]-110[p] shown in FIG. 1. The calibration cell 220 can serve as an embodiment of the calibration cell 120 shown in FIG. 1.

The variable impedance circuit 210 includes, but is not limited to, a plurality of conduction paths CP[0]-CP[x] connected in parallel between a supply terminal TSP and an output terminal $PD_{OUT}$, where x is a positive integer. The supply terminal TSP is coupled to a supply voltage VSPx. The variable impedance circuit 210 can be configured to enable at least one of the conduction paths CP[0]-CP[x] to provide an impedance $Z_{IO}$ at the output terminal $PD_{OUT}$. In addition, the variable impedance circuit 210 can be configured to adjust the impedance $Z_{IO}$ by enabling/disabling one or more of the conduction paths CP[0]-CP[x] according to the calibration code CC. For example, the impedance $Z_{IO}$ may be the equivalent impedance presented between the supply terminal TSP and the output terminal $PD_{OUT}$. The impedance $Z_{IO}$ will decrease when the number of enabled conduction paths increases. The impedance $Z_{IO}$ will increase when the number of disabled conduction paths increases.

In the present embodiment, respective impedances of two or more of the conduction paths CP[0]-CP[x] may be different from each other. An impedance of a conduction path as used herein refers to an impedance presented by the conduction path in a conductive state. The amount of impedance adjustment may vary with the impedance of each conduction path that is enabled/disabled according to the calibration code CC. For example, the conduction paths CP[1] and CP[2] may have different impedances. In some cases where the conduction path CP[0] is enabled and the remaining conduction paths are disabled, the variable impedance circuit 210 may provide the impedance $Z_{IO}$ of a certain value. When the conduction path CP[1] is enabled and the conduction path CP[2] is disabled, the variable impedance circuit 210 may adjust the impedance $Z_{IO}$ by a first calibration amount. The impedance $Z_{IO}$ can be contributed by the conduction paths CP[0] and CP[1]. When the conduction path CP[1] is disabled and the conduction path CP[2] is enabled, the variable impedance circuit 210 may adjust the impedance $Z_{IO}$ by a second calibration amount. The impedance $Z_{IO}$ can be contributed by the conduction paths CP[0] and CP[2]. Note that the second calibration amount is different from the first calibration amount since the conduction path CP[2] has an impedance different from that of the conduction path CP[1].

The calibration cell 220 includes, but is not limited to, a detection circuit 230 and a control circuit 240. The detection circuit 230 is configured to detect a change in impedance of the conduction paths CP[0]-CP[x] by applying a supply voltage $VSP_Y$ to the reference terminal $PD_{REF}$ through a detection path $CP_D$, and accordingly generate the input voltage $V_{IN}$ at the reference terminal $PD_{REF}$. An electric potential of the supply voltage $VSP_Y$ is equal to, or substantially equal to, an electric potential of the supply voltage $VSP_X$ coupled to the supply terminal TSP. The detection path $CP_D$ can be arranged for tracking an impedance characteristic of at least one of the conduction paths CP[0]-CP[x]. By way of example but not limitation, the detection path $CP_D$ may have an impedance $Z_D$ indicative of an impedance of at least one conduction path of the variable impedance circuit 210. The impedance $Z_D$ can represent an impedance presented by the detection path $CP_D$ in a conductive state. The impedance $Z_D$ can change with variations in impedance of the at least one conduction path.

In some examples, the impedance $Z_D$ can be indicative of an equivalent impedance of multiple conduction paths in parallel included in the variable impedance circuit 210. The detection path $CP_D$ may be, but is not limited to, a replica of an equivalent circuit of the multiple conduction paths in parallel. In some other examples, the impedance $Z_D$ can be indicative of an impedance of a single conduction path included in the variable impedance circuit 210. The detection path $CP_D$ may be, but is not limited to, a replica of the single conduction path.

Note that the impedance $Z_{REF}$ of the impedance element $R_{ZQ}$ can be unaffected by variations in impedance of the at least one conduction path. A change in the input voltage $V_{IN}$ may mainly result from a change in impedance of the detection path $CP_D$, and therefore can reflect variations in impedance of the at least one conduction path.

The control circuit 240, coupled to the variable impedance circuit 210 and the detection circuit 230, is configured to compare the input voltage $V_{IN}$ with a plurality of reference voltages {VR} to generate the calibration code CC. For example, respective voltage levels of the reference voltages {VR} may correspond to different amounts of change in the impedance of the at least one conduction path. Different code values of the calibration code CC may correspond to different calibration amounts by which the impedance $Z_{IO}$ would be adjusted.

In the embodiment shown in FIG. 2A, the supply voltage $VSP_X$ supplied to the supply terminal TSP may have a reference potential which can be a positive electric potential, a negative electric potential or a ground potential. By coupling the supply voltage $VSP_Y$ (having an electric potential equal to that of a supply voltage coupled to the supply terminal TSP) to the reference terminal $PD_{REF}$, the calibration cell 220 can be configured to detect the effect of PVT variations on an impedance characteristic of one or more conduction paths which are coupled to a positive electric potential, a negative electric potential or a ground potential.

Figure 2B:
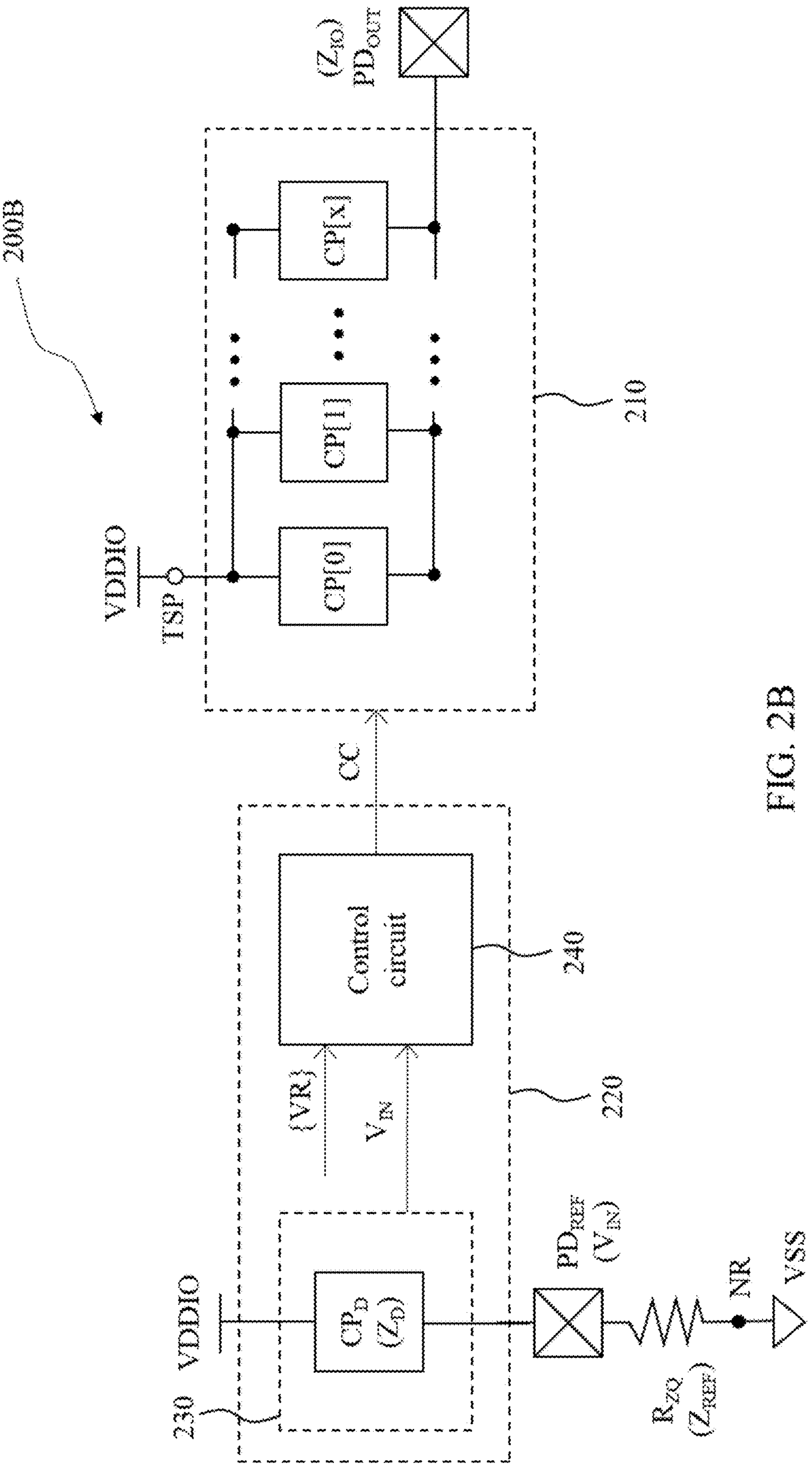
FIG. 2B and FIG. 2C illustrate implementations of the impedance calibration circuit shown in FIG. 2A in accordance with some embodiments of the present disclosure.

For example, referring to FIG. 2B, the impedance calibration circuit 200B can be configured to perform ZQ calibration by detecting the effect of PVT variations on the conduction paths CP[0]-CP[x] coupled to a supply voltage VDDIO. The detection circuit 230 can be configured to apply the supply voltage VDDIO (i.e. a supply voltage coupled to the supply terminal TSP) to the reference terminal $PD_{REF}$ to thereby detect a change in impedance of the conduction paths CP[0]-CP[x]. Each of the supply voltages $VSP_X$ and $VSP_Y$ shown in FIG. 2A can be implemented using the supply voltage VDDIO, which can be a positive power supply voltage. In addition, the impedance element $R_{ZQ}$ is coupled to a supply voltage VSS through the node NR. The supply voltage VSS can have a voltage potential lower than that of the supply voltage VDDIO. In the present embodiment, the supply voltage VSS may be, but is not limited to, a ground voltage or a negative power supply voltage.

Figure 2C:
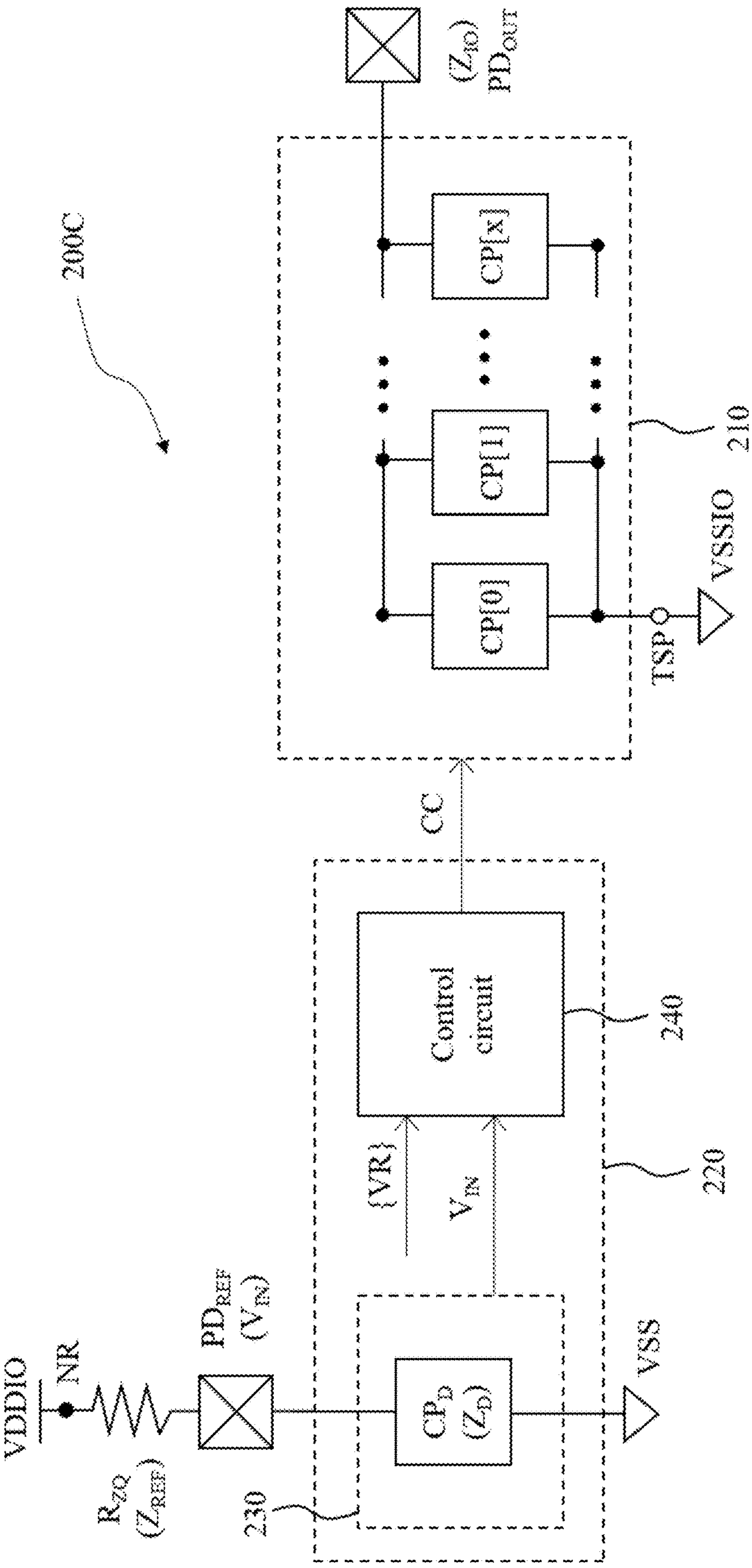

As another example, referring to FIG. 2C, the impedance calibration circuit 200C can be configured to perform ZQ calibration by detecting the effect of PVT variations on the conduction paths CP[0]-CP[x] coupled to a supply voltage VSSIO, which may be a ground voltage or a negative power supply voltage. The detection circuit 230 can be configured to apply the supply voltage VSS (having an electric potential equal to that of the supply voltage VSSIO) to the reference terminal $PD_{REF}$ to thereby detect a change in impedance of the conduction paths CP[0]-CP[x]. The supply voltages VSSIO and VSS can serve as embodiments of the supply voltages $VSP_X$ and $VSP_Y$ shown in FIG. 2A, respectively. The supply voltages VSSIO and VSS can have substantially the same electric potential, but may be electrically isolated from each other. In addition, the impedance element $R_{ZQ}$ is coupled to the supply voltage VDDIO through the node NR. The supply voltage VDDIO can have a voltage potential higher than that of the supply voltage VSS. In the present embodiment, the supply voltage VDDIO may be, but is not limited to, a positive power supply voltage.

Note that in some embodiments, the detection circuit 230 can be configured to apply the supply voltage VSSIO (i.e. a supply voltage coupled to the supply terminal TSP) to the reference terminal $PD_{REF}$ to thereby detect a change in impedance of the conduction paths CP[0]-CP[x] without departing from the scope of the present disclosure.

To facilitate understanding of the present disclosure, some embodiments are given as follows for further description of the proposed impedance calibration scheme. Those skilled in the art should appreciate that other embodiments employing the calibration architecture shown in FIGS. 2A/2B/2C are also within the contemplated scope of the present disclosure.

Figure 3:
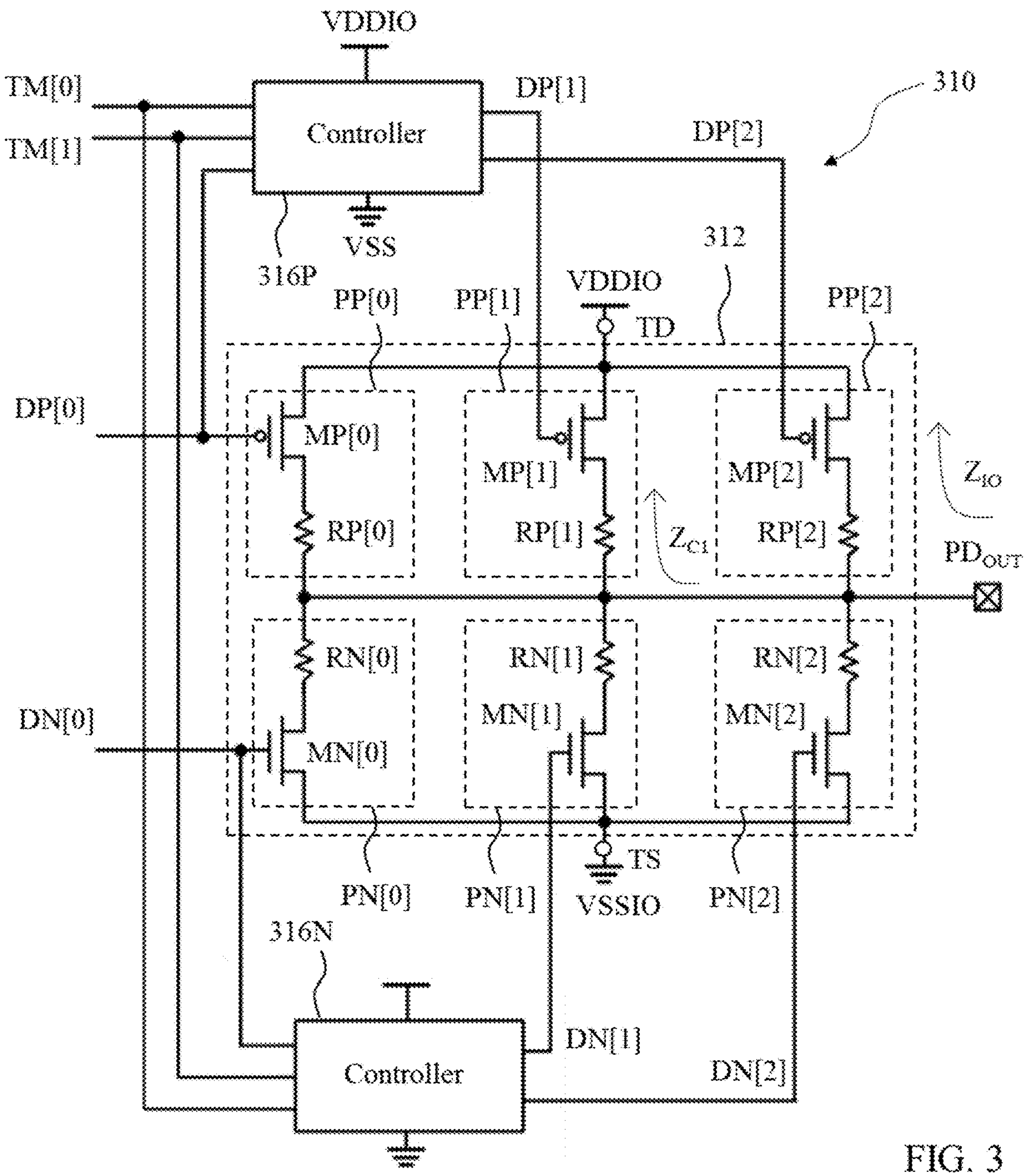
FIG. 3 illustrates an implementation of the variable impedance circuit shown in FIG. 2B in accordance with some embodiments of the present disclosure.
Figure 4:
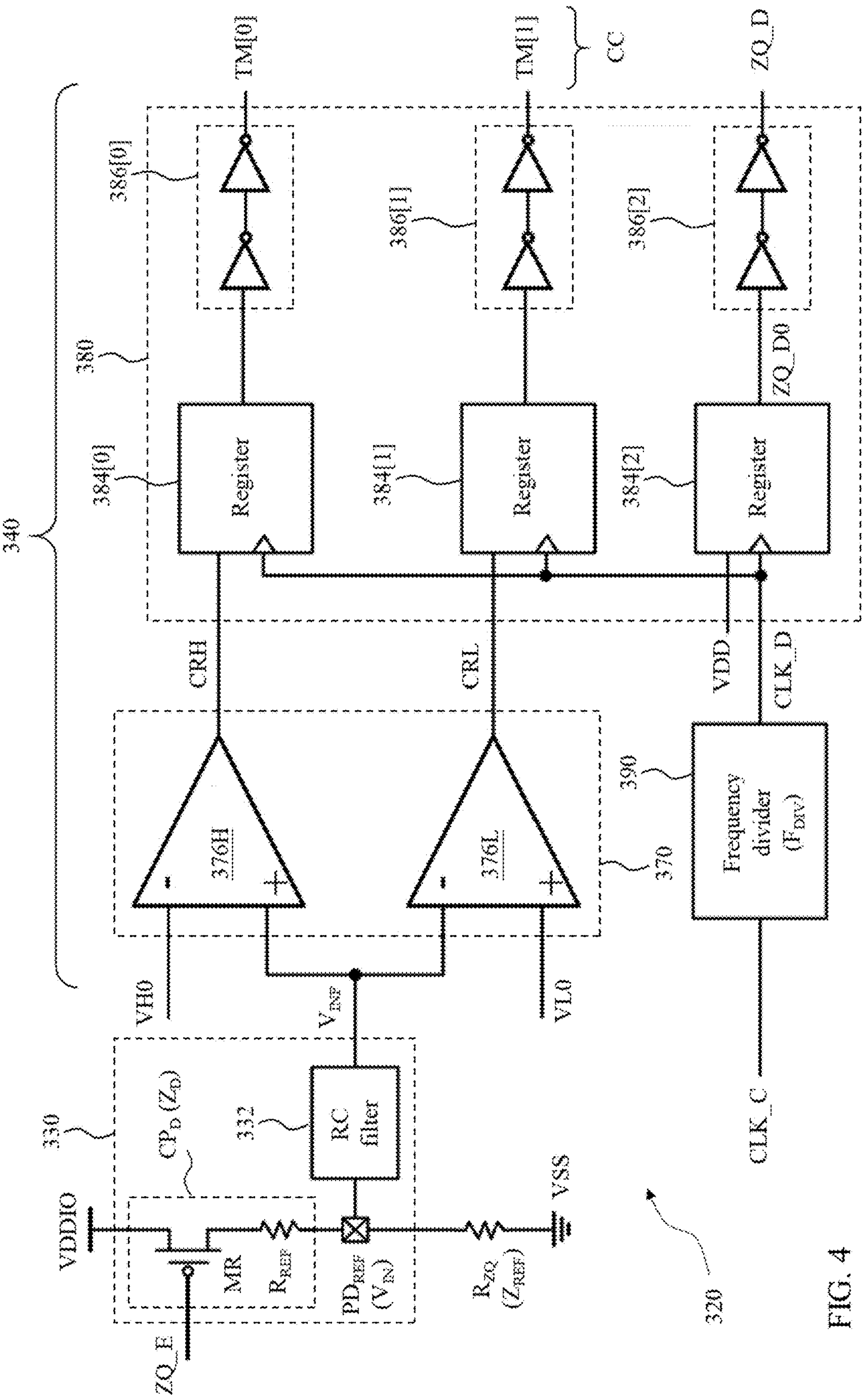
FIG. 4 illustrates an implementation of the calibration cell shown in FIG. 2B in accordance with some embodiments of the present disclosure.

FIG. 3 illustrates an implementation of the variable impedance circuit 210 shown in FIG. 2B in accordance with some embodiments of the present disclosure. FIG. 4 illustrates an implementation of the calibration cell 220 shown in FIG. 2B in accordance with some embodiments of the present disclosure. The calibration cell 320 shown in FIG. 4 is operable with the variable impedance circuit 310 shown in FIG. 3 to realize an open loop calibration mechanism.

Referring firstly to FIG. 3, the variable impedance circuit 310 includes, but is not limited to, a driver circuit 312 and a plurality of controllers 316P and 316N. The driver circuit 312 is controlled by the drive signals DP[0]-DP[2] and DN[0]-DN[2] to adjust the equivalent impedance at the output terminal $PD_{OUT}$. The driver circuit 312 may include a plurality of conduction paths PP[0]-PP[2] connected in parallel between the supply terminal TD and the output terminal $PD_{OUT}$. The conduction paths PP[0]-PP[2] may represent an embodiment of the conduction paths CP[0]-CP[x] shown in FIG. 2B. The conduction paths PP[0]-PP[2] are controlled by the drive signals DP[0]-DP[2], respectively. By enabling one or more of the conduction paths PP[0]-PP[2] according to the drive signals DP[0]-DP[2], the driver circuit 312 can adjust the equivalent impedance presented between the supply terminal TD and the output terminal $PD_{OUT}$, i.e. the impedance $Z_{IO}$.

The driver circuit 312 may further include a plurality of conduction paths PN[0]-PN[2] connected in parallel between the supply terminal TS and the output terminal $PD_{OUT}$. The supply terminal TS can be coupled to a supply voltage VSSIO having a voltage potential lower than that of the supply voltage VDDIO. The supply voltage VSSIO may be, but is not limited to, a ground voltage. The conduction paths PN[0]-PN[2] are controlled by the drive signals DN[0]-DN[2], respectively. The driver circuit 312 can enable one or more of the conduction paths PN[0]-PN[2] according to the drive signals DN[0]-DN[2], thereby adjusting the equivalent impedance presented between the supply terminal TS and the output terminal $PD_{OUT}$.

In the present embodiment, the impedance of the conduction path PP[i] can be equal to or substantially equal to the impedance of the conduction path PN[i], where i=0, 1, 2. The conduction path PP[i] may include a switch MP[i] and an impedance element RP[i] connected in series. The switch MP[i], controlled by the drive signals DP[i], can be implemented using a p-channel transistor. When the switch MP[i] is turned on, the conduction path PP[i] is enabled, and the impedance of the impedance element RP[i] can serve as the impedance of the conduction path PP[i]. Similarly, the conduction path PN[i] may include a switch MN[i] and an impedance element RN[i] connected in series. The switch MN[i], controlled by the drive signals DN[i], can be implemented using an n-channel transistor. When the switch MN[i] is turned on, the conduction path PN[i] is enabled, and the impedance of the impedance element RN[i] can serve as the impedance of the conduction path PN[i].

The controller 316P is configured to generate the drive signals DP[1] and DP[2] according to the trim bit TM[0], the trim bit TM[1] and the drive signal DP[0]. The controller 316N is configured to generate the drive signals DN[1] and DN[2] according to the trim bit TM[0], the trim bit TM[1] and the drive signal DP[0]. The trim bits TM[0] and TM[1] can serve as an embodiment of the calibration code CC shown in FIG. 2B. In the present embodiment, the driver signals DP[0] and DN[0] can be provided from a pre-driver of the variable impedance circuit 310 (not shown in FIG. 3). In addition, the controller 316P/316N is coupled to the supply voltage VSS. The supply voltages VSS and VSSIO can have substantially the same electric potential, but may be electrically isolated from each other.

Referring to FIG. 4 and also to FIG. 3, the calibration cell 320 operable with the variable impedance circuit 310 may include a detection circuit 330 and a control circuit 340, which can represent implementations of the detection circuit 230 and the control circuit 240 shown in FIG. 2B respectively. The detection circuit 330 may utilize the detection path $CP_D$ to detect a change in impedance of the conduction paths PP[0]-PP[2]. In the present embodiment, the impedance $Z_D$ can be indicative of an equivalent impedance $Z_{C1}$ of the conduction paths PP[0] and PP[1] in parallel. The detection path $CP_D$ may include a switch MR and an impedance element $R_{REF}$ connected in series, which can be used to track impedance characteristics of the conduction paths PP[0] and PP[1] in parallel. For example, the switch MR can be implemented using a p-channel transistor, which can be formed based on the size of the p-channel transistor used for implementing the switch MP[0]/MP[1]. The impedance element $R_{REF}$ can be formed based on the dimensions of the impedance elements RP[0] and RP[1].

The switch MR can be controlled by the enable signal ZQ_E. When the switch MR is turned on, the detection circuit 330 can apply the supply voltage VDDIO to the impedance element $R_{REF}$. The impedance element $R_{REF}$ and the impedance element $R_{ZQ}$ can serve as a voltage divider for generate the input voltage $V_{IN}$ at the reference terminal $PD_{REF}$. As the impedance $Z_{REF}$ of the impedance element $R_{ZQ}$ is substantially unaffected by PVT variations, the input voltage $V_{IN}$ can vary with variations in impedance of the impedance element $R_{REF}$. In addition, as the impedance of the impedance element $R_{REF}$ can vary with impedance variations in the parallel combination of the conduction paths PP[0] and PP[1], the input voltage $V_{IN}$ can reflect a change in the equivalent impedance $Z_{C1}$.

For example, when no or negligible PVT variation occurs, the equivalent impedance $Z_{C1}$ may be equal to a nominal impedance, which is equal to the impedance $Z_{REF}$. The impedance element $R_{REF}$ can have an impedance equal to the nominal impedance. When PVT variations cause the equivalent impedance $Z_{C1}$ to be less than the nominal impedance, the impedance element $R_{REF}$ would have an impedance less the nominal impedance, which results in an increase in the input voltage $V_{IN}$. When PVT variations cause the equivalent impedance $Z_{C1}$ to be greater than the nominal impedance, the impedance element $R_{REF}$ would have an impedance greater the nominal impedance, which results in a decrease in the input voltage $V_{IN}$.

In the example of FIG. 4, the detection circuit 330 may further include a resistor-capacitor (RC) filter 332 for noise reduction. In other words, the RC filter 332 can reduce or eliminate the noise component of the input voltage $V_{IN}$ to thereby generate a filtered version of the input voltage $V_{IN}$, i.e. the input voltage $V_{INF}$.

The control circuit 340 may include a comparison circuit 370, a processing circuit 380 and a frequency divider 390. The comparison circuit 370 is configured to compare a filtered version of the input voltage $V_{IN}$ (i.e. the input voltage $V_{INF}$) with a plurality of reference voltages VH0 and VL0 to determine a voltage range in which the input voltage $V_{IN}/V_{INF}$ falls. The reference voltage VH0 can be greater than the reference voltage VL0. For example, the comparison circuit 370 may include a plurality of comparators 376H and 376L. The comparator 376H is configured to compare the input voltage $V_{INF}$ with the reference voltage VH0 to generate a comparison result CRH, which can indicate whether the input voltage $V_{IN}/V_{INF}$ is greater than the reference voltage VH0. The comparator 376L is configured to compare the input voltage $V_{INF}$ with the reference voltage VL0 to generate a comparison result CRL, which can indicate whether the input voltage $V_{IN}/V_{INF}$ is greater than the reference voltage VL0.

The processing circuit 380 is configured to process the comparison results CRH and CRL to generate the calibration code CC, i.e. the trim bits TM[0] and TM[1]. For example, the processing circuit 380 may include a plurality of registers 384[0]-384[2] and a plurality of buffers 386[0]-386[2]. Each of the registers 384[0]-384[2] can be triggered by a clock signal CLK_D. The register 384[0] is configured to store and output the comparison result CRH. The buffer 386[0] is configured to output the trim bit TM[0] according to an output of the register 384[0]. Similarly, the register 384[1] is configured to store and output the comparison result CRL. The buffer 386[1] is configured to output the trim bit TM[1] according to an output of the register 384[1]. In addition, the register 384[2] is configured to receive the supply voltage VDD, and assert an output signal ZQ_D0 in response to the clock signal CLK_D. The buffer 386[2] is configured to buffer the output signal ZQ_D0 to generate the output signal ZQ_D. In the present embodiment, each of the buffers 386[0]-386[2] can be implemented using two inverters connected in series.

The frequency divider 390 is configured to divide the frequency of the clock signal CLK_C by a division factor of $F_{DIV}$ to generate the clock signal CLK_D, where $F_{DIV}$ is a real number. As a result, each of the registers 384[0]-384[2] can be triggered once every $F_{DIV}$ clock cycles of the clock signal CLK_C. By way of example but not limitation, $F_{DIV}$ may be equal to $2^{10}$. The register 384[2] can assert the output signal ZQ_D0 after $2^{10}$ clock cycles of the clock signal CLK_C has elapsed since assertion of the enable signal ZQ_E. Additionally, the output signal ZQ_D can be asserted to indicate that the ZQ calibration is done.

Figure 5:
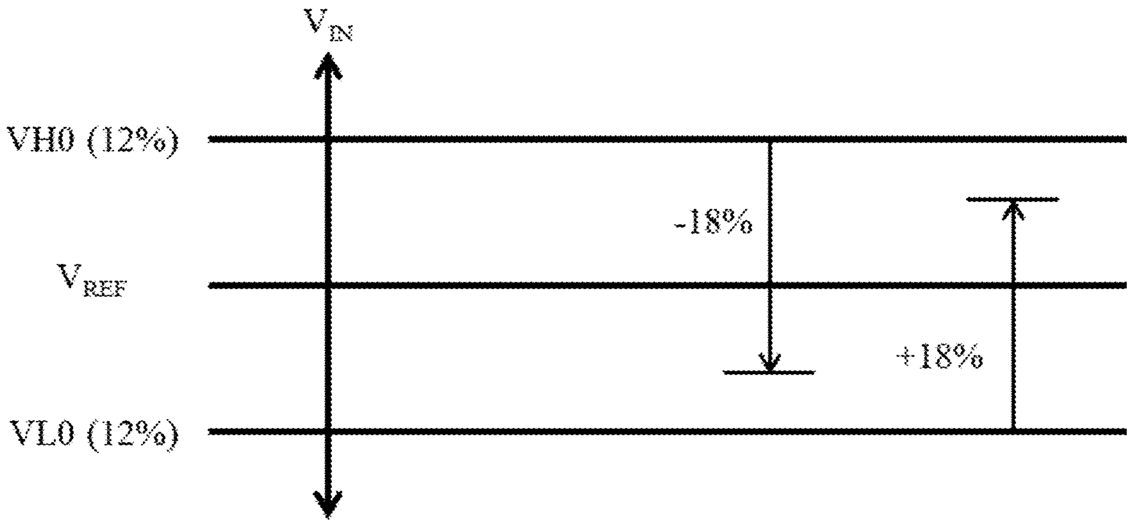
FIG. 5 illustrates an implementation of the reference voltages shown in FIG. 4 in accordance with some embodiments of the present disclosure.

FIG. 5 illustrates an implementation of the reference voltages VH0 and VL0 shown in FIG. 4 in accordance with some embodiments of the present disclosure. In the present embodiment, the input voltage $V_{IN}$ is substantially equal to a reference voltage $V_{REF}$ when the equivalent impedance $Z_{C1}$ shown in FIG. 3 is equal to a nominal impedance. The input voltage $V_{IN}$ would reach the reference voltage VH0 when the equivalent impedance $Z_{C1}$ shown in FIG. 3 falls below the nominal impedance by P % of the nominal impedance. The input voltage $V_{IN}$ would reach the reference voltage VL0 when the equivalent impedance $Z_{C1}$ shown in FIG. 3 exceeds the nominal impedance by Q % of the nominal impedance. In other words, the reference voltage $V_{REF}$ may correspond to the nominal impedance. The reference voltage VH0 may correspond to a P % reduction in impedance compared to the nominal impedance. The reference voltage VL0 may correspond to a Q % increase in impedance compared to the nominal impedance. In the example of FIG. 5, the reference voltages VH0 and VL0 can be set to appropriate levels such that both P and Q can be 12. However, those skilled in the art can appreciate that the reference voltage VH0/VL0 can be set to any appropriate level without departing from the scope of the present disclosure. In other words, P and/or Q may vary depending on design requirements.

Referring to FIG. 3, FIG. 4 and FIG. 5, in operation, the switch MR is turned on in response to assertion of the enable signal ZQ_E. The supply voltage VDDIO is applied to the impedance element $R_{REF}$ to create the input voltage $V_{IN}$ at the reference terminal $PD_{REF}$. The comparator 376H can compare a filtered version of the input voltage $V_{IN}$ (the input voltage $V_{INF}$) with the reference voltage VH0 to determine whether the input voltage $V_{IN}$ is greater than the reference voltage VH0. The comparator 376L can compare a filtered version of the input voltage $V_{IN}$ (the input voltage $V_{INF}$) with the reference voltage VL0 to determine whether the input voltage $V_{IN}$ is greater than the reference voltage VL0. The processing circuit 380 can generate the calibration code CC according to the comparison results CRH and CRL. With the use of the calibration code CC, the variable impedance circuit 310 can provide the impedance $Z_{IO}$ that falls within a predetermined impedance range.

When the input voltage $V_{IN}$ is greater than the reference voltage VL0 and less than the reference voltage VH0, the equivalent impedance $Z_{C1}$ may lie within a tolerance range of a nominal impedance, e.g. a range of plus or minus 12% of the impedance $Z_{REF}$. The variable impedance circuit 310 can enable the conduction paths PP[0] and PP[1] and disable the conduction path PP[2]. In other words, the switches MP[0] and MP[1] are turned on, and the switch MP[2] is turned off. As a result, the equivalent impedance $Z_{C1}$ of the conduction paths PP[0] and PP[1] in parallel can serve as the impedance $Z_{IO}$, which lies within a range of plus or minus 12% of the impedance $Z_{REF}$.

When the input voltage $V_{IN}$ is less than the reference voltage VL0, the equivalent impedance $Z_{C1}$ may exceed the impedance $Z_{REF}$ by more than 12% of the impedance $Z_{REF}$. To compensate for the increase in impedance caused by PVT variations, the variable impedance circuit 310 can enable the conduction path PP[2] to adjust an impedance presented between the supply terminal TD and the output terminal $PD_{OUT}$. For example, the switches MP[0]-MP[2] are turned on to enable the conduction paths PP[0]-PP[2], respectively. The resulting impedance $Z_{IO}$ can exhibit a decrease, such as 18% of the impedance $Z_{REF}$, compared to an impedance contributed by the conduction paths PP[0] and PP[1] in parallel. In other words, the variable impedance circuit 310 can enable the conduction path PP[2] to compensate for an increase in impedance, such as 18% of the impedance $Z_{REF}$.

When the input voltage $V_{IN}$ is greater than the reference voltage VH0, the equivalent impedance $Z_{C1}$ may fall below the impedance $Z_{REF}$ by more than 12% of the impedance $Z_{REF}$. To compensate for the reduction in impedance caused by PVT variations, the variable impedance circuit 310 can disable the conduction path PP[1] to adjust an impedance presented between the supply terminal TD and the output terminal PD OUT. For example, the switches MP[1] and MP[2] are turned off to disable the conduction paths PP[1] and PP[2]. The switch MP[0] is turned on to enable the conduction path PP[0]. The resulting impedance $Z_{IO}$ can exhibit an increase, such as 18% of the impedance $Z_{REF}$, compared to an impedance contributed by the conduction paths PP[0] and PP[1] in parallel. In other words, the variable impedance circuit 310 can disable the conduction path PP[1] to compensate for a reduction in impedance, such as 18% of the impedance $Z_{REF}$.

In the present embodiment, the impedance of the conduction path PP[i] can be equal to or substantially equal to the impedance of the conduction path PN[i], where i=0, 1, 2. For example, the impedance of the impedance element RP[i] can be substantially equal to the impedance of the impedance element RN[i]. The variable impedance circuit 310 can enable the conduction path PN[0], and disable the conduction paths PN[1] and PN[2] to provide an impedance presented between the supply terminal TS and the output terminal $PD_{OUT}$, which may exhibit an 18% increase of the impedance $Z_{REF}$ compared to an impedance contributed by the conduction paths PN[0] and PN[1] in parallel. Alternatively, the variable impedance circuit 310 can enable each of the conduction paths PN[0]-PN[2] to provide an impedance presented between the supply terminal TS and the output terminal $PD_{OUT}$, which may exhibit a 18% decrease of the impedance $Z_{REF}$ compared to an impedance contributed by the conduction paths PN[0] and PN[1] in parallel. As those skilled in the art can appreciate the calibration operation associated with the conduction paths PN[0]-PN[2] after reading the above paragraphs directed to FIG. 1 to FIG. 5, similar description is omitted here for brevity.

Figure 6:
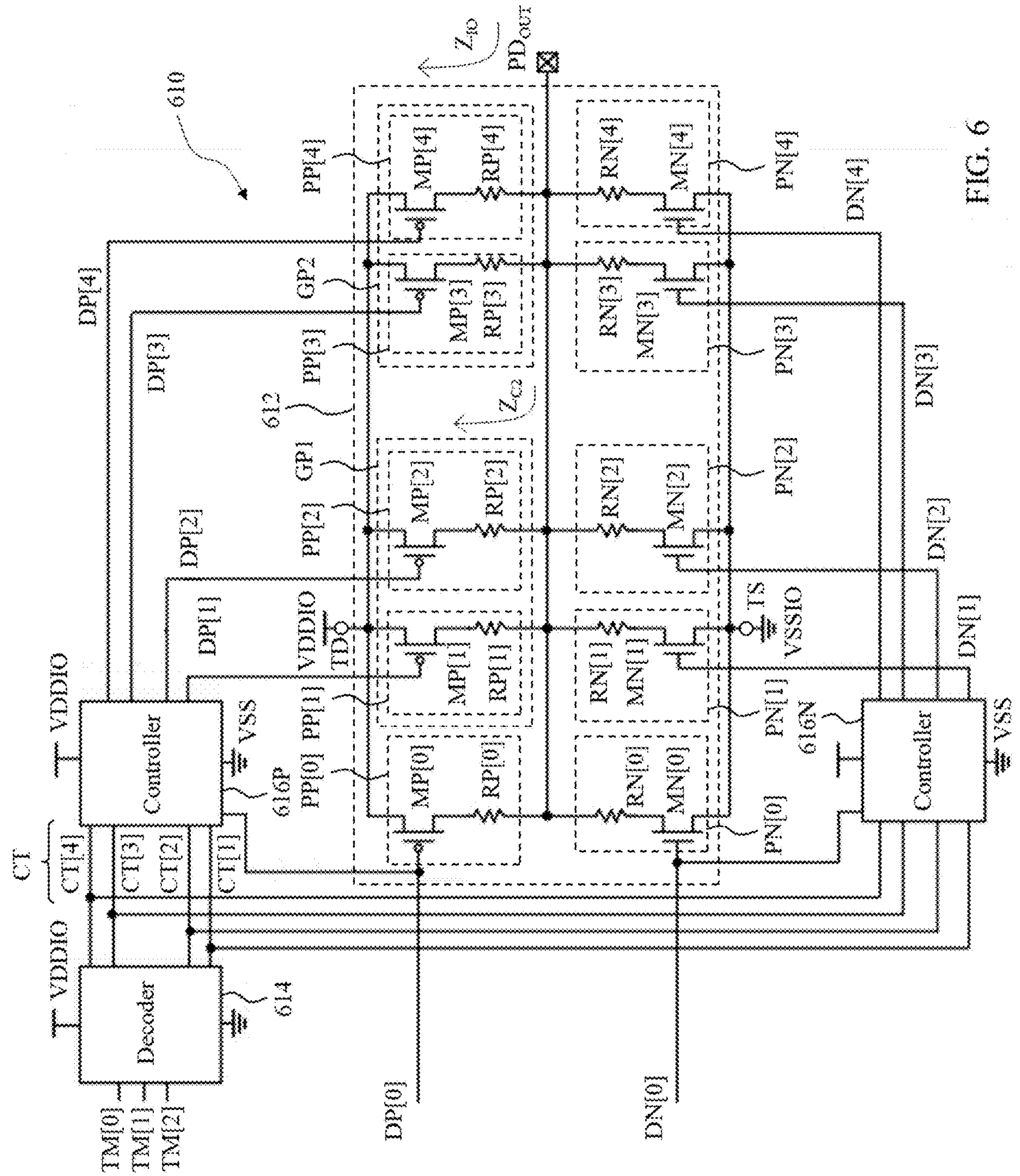
FIG. 6 illustrates another implementation of the variable impedance circuit shown in FIG. 2B in accordance with some embodiments of the present disclosure.
Figure 7:
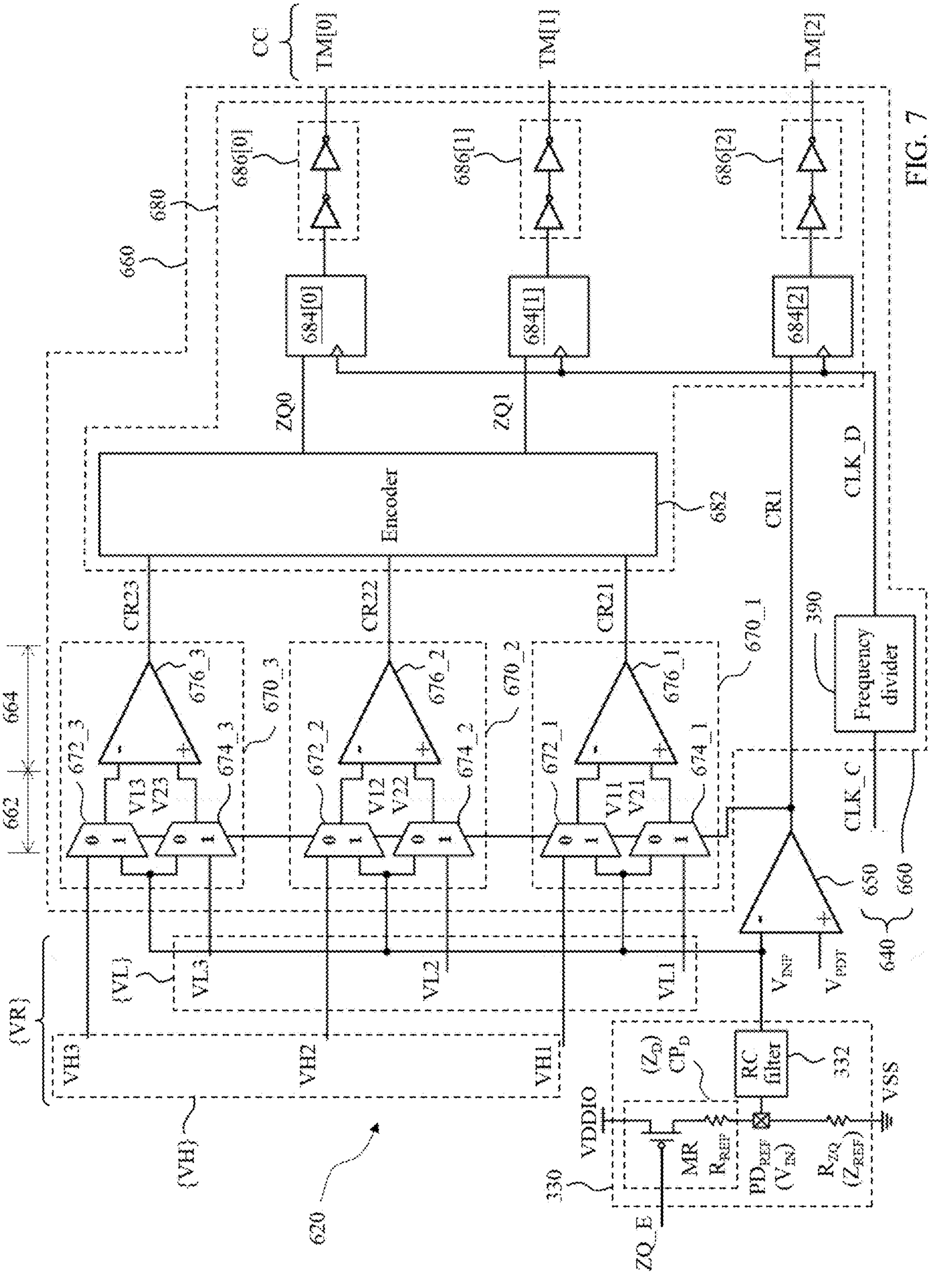
FIG. 7 illustrates another implementation of the calibration cell shown in FIG. 2B in accordance with some embodiments of the present disclosure.

FIG. 6 illustrates another implementation of the variable impedance circuit 210 shown in FIG. 2B in accordance with some embodiments of the present disclosure. FIG. 7 illustrates another implementation of the calibration cell 220 shown in FIG. 2B in accordance with some embodiments of the present disclosure. The calibration cell 620 shown in FIG. 7 can be operable with the variable impedance circuit 610 shown in FIG. 6 to realize an open loop calibration mechanism.

Referring firstly to FIG. 6, the variable impedance circuit 610 includes, but is not limited to, a driver circuit 612, a decoder 614, and a plurality of controllers 616P and 616N. The driver circuit 612 is controlled by the drive signals DP[0]-DP[4] and DN[0]-DN[4] to adjust the equivalent impedance at the output terminal $PD_{OUT}$. The driver circuit 612 may include a plurality of conduction paths PP[0]-PP[4] connected in parallel between the supply terminal TD and the output terminal $PD_{OUT}$. The conduction paths PP[0]-PP[4] may represent an embodiment of the conduction paths CP[0]-CP[x] shown in FIG. 2B. The conduction paths PP[0]-PP[4] are controlled by the drive signals DP[0]-DP[4], respectively. By enabling one or more of the conduction paths PP[0]-PP[4] according to the drive signals DP[0]-DP[4], the driver circuit 612 can adjust the equivalent impedance presented between the supply terminal TD and the output terminal $PD_{OUT}$, i.e. the impedance $Z_{IO}$.

The driver circuit 612 may further include a plurality of conduction paths PN[0]-PN[4] connected in parallel between the supply terminal TS and the output terminal $PD_{OUT}$. The conduction paths PN[0]-PN[4] are controlled by the drive signals DN[0]-DN[4], respectively. The driver circuit 612 can enable one or more of the conduction paths PN[0]-PN[4] according to the drive signals DN[0]-DN[4], thereby adjusting the equivalent impedance presented between the supply terminal TS and the output terminal $PD_{OUT}$.

In the present embodiment, the impedance of the conduction path PP[i] can be equal to or substantially equal to the impedance of the conduction path PN[i], where i=0 to 4. The conduction path PP[i] may include a switch MP[i] and an impedance element RP[i] connected in series. The switch MP[i], controlled by the drive signals DP[i], can be implemented using a p-channel transistor. When the switch MP[i] is turned on, the conduction path PP[i] is enabled, and the impedance of the impedance element RP[i] can serve as the impedance of the conduction path PP[i]. Similarly, the conduction path PN[i] may include a switch MN[i] and an impedance element RN[i] connected in series. The switch MN[i], controlled by the drive signals DN[i], can be implemented using an n-channel transistor. When the switch MN[i] is turned on, the conduction path PN[i] is enabled, and the impedance of the impedance element RN[i] can serve as the impedance of the conduction path PN[i]. The impedance of the impedance element RP[i] can be substantially equal to the impedance of the impedance element RN[i].

The controller 616P can be configured to generate the drive signals DP[1]-DP[4] according to a control code CT and the drive signal DP[0] used for controlling the conduction path PP[0]. By way of example but not limitation, the control code CT includes four control bits CT[1]-CT[4]. The controller 616P may determine a logic state of the drive signal DP[j] according to the control bit CT[j], where j=1 to 4. In addition, the controller 616P may determine a voltage level of the drive signal DP[j] in the logic state according to a voltage level of the drive signal DP[0]. Similarly, the controller 616N can be configured to generate the drive signals DN[1]-DN[4] according to the control code CT and the drive signal DN[0] used for controlling the conduction path PN[0]. By way of example but not limitation, the controller 616N may determine a logic state of the drive signal DN[j] according to the control bit CT[j], where j=1 to 4. In addition, the controller 616N may determine a voltage level of the drive signal DN[j] in the logic state according to a voltage level of the drive signal DN[0].

The decoder 614, coupled to the controllers 616P and 616N, is configured to decode the calibration code CC to generate the control code CT. In the present embodiment, the calibration code CC can be implemented as the trim bits TM[0]-TM[2], which will be described later.

Referring to FIG. 7 and also to FIG. 6, the calibration cell 620 operable with the variable impedance circuit 610 may include the detection circuit 330 shown in FIG. 3 and the control circuit 640, which can represent an implementation of the control circuit 240 shown in FIG. 2B. In the present embodiment, the conduction paths PP[0]-PP[4] can be divided into the conduction path PP[0], a group of conduction paths GP1 and a group of conduction paths GP2. The group of conduction paths GP1 includes the conduction paths PP[1] and PP[2]. The group of conduction paths GP2 includes the conduction paths PP[3] and PP[4]. The impedance $Z_D$ of the detection path $CP_D$ can be indicative of an equivalent impedance $Z_{C2}$ of the conduction path PP[0] and the group of conduction paths GP1 in parallel. The detection circuit 330 may utilize the detection path $CP_D$ to track impedance characteristics of the conduction paths PP[0]-PP[2] in parallel. For example, the switch MR can be implemented using a p-channel transistor, which can be formed based on the size of the p-channel transistor used for implementing the switch MP[0]/MP[1]/MP[2]. The impedance element $R_{REF}$ can be formed based on the dimensions of the impedance elements RP[0]-RP[2]. The input voltage $V_{IN}$ at the reference terminal $PD_{REF}$ can reflect a change in the equivalent impedance $Z_{C2}$.

The control circuit 640 is configured to compare the input voltage $V_{IN}$ with the plurality of reference voltages {VR} to generate the trim bits TM[0]-TM[2]. In the present embodiment, the plurality of reference voltages {VR} may include a predetermined reference voltage $V_{PDT}$, a set of reference voltages {VH} and a set of reference voltages {VL}. The control circuit 640 may include a comparator 650 and a signal generator circuit 660.

The comparator 650 is configured to compare a filtered version of the input voltage $V_{IN}$ (i.e. the input voltage $V_{INF}$) with the predetermined reference voltage $V_{PDT}$ to generate a comparison result CR1. The signal generator circuit 660, coupled to the comparator 650, can be configured to generate a second portion of the calibration code CC by comparing the filtered version of the input voltage $V_{IN}$ (i.e. the input voltage $V_{INF}$) with one set of reference voltages selected from among the set of reference voltages {VH} and the set of reference voltages {VL} according to the comparison result CR1. The set of reference voltages {VH} is different from the set of reference voltages {VL}. For example, each reference voltage in the set of reference voltages {VH} is different from each reference voltage in the set of reference voltages {VL}. As another example, each reference voltage in the set of reference voltages {VH} is greater than the predetermined reference voltage $V_{PDT}$, and each reference voltage in the set of reference voltages {VL} is less than the predetermined reference voltage $V_{PDT}$.

In the present embodiment, the set of reference voltages {VH} may include different reference voltages VH1-VH3, each of which is greater than the predetermined reference voltage $V_{PDT}$. The set of reference voltages {VL} may include different reference voltages VL1-VL3, each of which is less than the predetermined reference voltage $V_{PDT}$. When the comparison result CR1 indicates that the input voltage $V_{IN}$ is greater the predetermined reference voltage $V_{PDT}$, the signal generator circuit 660 is configured to compare the input voltage $V_{IN}$ with the set of reference voltages {VH} to generate the second portion of the calibration code CC. When the comparison result CR1 indicates that the input voltage $V_{IN}$ is less the predetermined reference voltage $V_{PDT}$, the signal generator circuit 660 is configured to compare the input voltage $V_{IN}$ with the set of reference voltages {VL} to generate the second portion of the calibration code CC. The comparison result CR1 can serve as the first portion of the calibration code CC. For example, the signal generator circuit 660 can store the comparison result CR1, and output the comparison result CR1 as the trim bit TM[2], which can indicate a relationship between the input voltage $V_{IN}$ and the predetermined reference voltage $V_{PDT}$. In addition, the second portion of the calibration code CC can be implemented as the trim bits TM[0] and TM[1] to indicate a relationship between the input voltage $V_{IN}$ and each reference voltage in the selected one set of reference voltages.

The signal generator circuit 660 includes, but is not limited to, N comparison circuits 670_1-670_N, a processing circuit 680, and the frequency divider 390 shown in FIG. 3, where N is an integer greater than one. In the example of FIG. 7, N is equal to 3, i.e. the number of reference voltages in the set of reference voltages {VH}/{VL}. The comparison circuits 670_1-670_3 are coupled to the reference voltages VH1-VH3 respectively, and coupled to the reference voltages VL1-VL3 respectively. The average of the two reference voltages coupled to a comparison circuit can be substantially equal to the predetermined reference voltage $V_{PDT}$. For example, the predetermined reference voltage $V_{PDT}$ can be half the supply voltage VDDIO. The average of the reference voltages VH1 and VL1 can be substantially equal to half the supply voltage VDDIO. Each comparison circuit is configured to compare the input voltage $V_{IN}$ with a corresponding reference voltage in the selected set of reference voltages, and accordingly generate a comparison result (i.e. one of the comparison results CR21-CR23).

In the present embodiment, the comparison circuit 670_*i* includes a multiplexer 672_*i*, a multiplexer 674_*i* and a comparator 676_*i*, where i=0, 1, 2. The multiplexer 672_*i* is configured to selectively output the input voltage $V_{IN}$ or a reference voltage in the set of reference voltages {VH}. The multiplexer 674_*i* is configured to selectively output the input voltage $V_{IN}$ or a reference voltage in the set of reference voltages {VL}. The comparator 676_*i* is configured to generate compare the input voltage $V_{IN}$ with a reference voltage outputted from one of the multiplexer 672_*i* and the multiplexer 674_*i*.

For example, the multiplexer 672_1 is configured to output one of the input voltage $V_{IN}$ and the reference voltage VH1 as a voltage V11 according to the comparison result CR1. The multiplexer 674_1 is configured to output one of the input voltage $V_{IN}$ and the reference voltage VL1 as a voltage V21 according to the comparison result CR1. When the multiplexer 672_1 is configured to output the reference voltage VH1 as the voltage V11, the multiplexer 674_1 is configured to output the input voltage $V_{IN}$ as the voltage V21. When the multiplexer 672_1 is configured to output the input voltage $V_{IN}$ as the voltage V11, the multiplexer 674_1 is configured to the reference voltage VL1 as the voltage V21. The comparator 676_1, coupled to the multiplexers 672_1 and 674_1, is configured to compare the voltage V11 with the voltage V21 to generate the comparison result CR21.

Similarly, the multiplexer 672_2 is configured to output one of the input voltage $V_{IN}$ and the reference voltage VH2 as a voltage V12 according to the comparison result CR1. The multiplexer 674_2 is configured to output one of the input voltage $V_{IN}$ and the reference voltage VL2 as a voltage V22 according to the comparison result CR1. The comparator 676_2 is configured to compare the voltage V12 with the voltage V22 to generate the comparison result CR22. The multiplexer 672_3 is configured to output one of the input voltage $V_{IN}$ and the reference voltage VH3 as a voltage V13 according to the comparison result CR1. The multiplexer 674_3 is configured to output one of the input voltage $V_{IN}$ and the reference voltage VL3 as a voltage V23 according to the comparison result CR1. The comparator 676_3 is configured to compare the voltage V13 with the voltage V23 to generate the comparison result CR23.

The processing circuit 680, coupled to the comparison circuits 670_1-670_3, is configured to process the comparison results CR21-CR23 to generate the trim bits TM[0] and TM[1]. The processing circuit 680 may include, but is not limited to, an encoder 682, a plurality of registers 684[0]-684[2], and a plurality of buffers 686[0]-686[2]. The encoder 682 is configured to encode the comparison results CR21-CR23 to generate the output codes ZQ0 and ZQ1. The registers 684[0]-684[2] can be implemented using the registers 384[0]-384[2] shown in FIG. 3. The registers 684[0]-684[2] can be configured to store the output code ZQ0, the output code ZQ1 and the comparison result CR1, respectively. The buffers 686[0]-686[2] can be implemented using the buffers 386[0]-386[2] shown in FIG. 3. The buffers 686[0]-686[2] can be configured to output the trim bits TM[0]-TM[2], respectively. In some embodiments, the processing circuit 680 may further include a register coupled in series with a buffer (e.g. the register 384[2] and the buffer 386[2] shown in FIG. 4) to output the output signal ZQ_D shown in FIG. 1.

Figure 8:
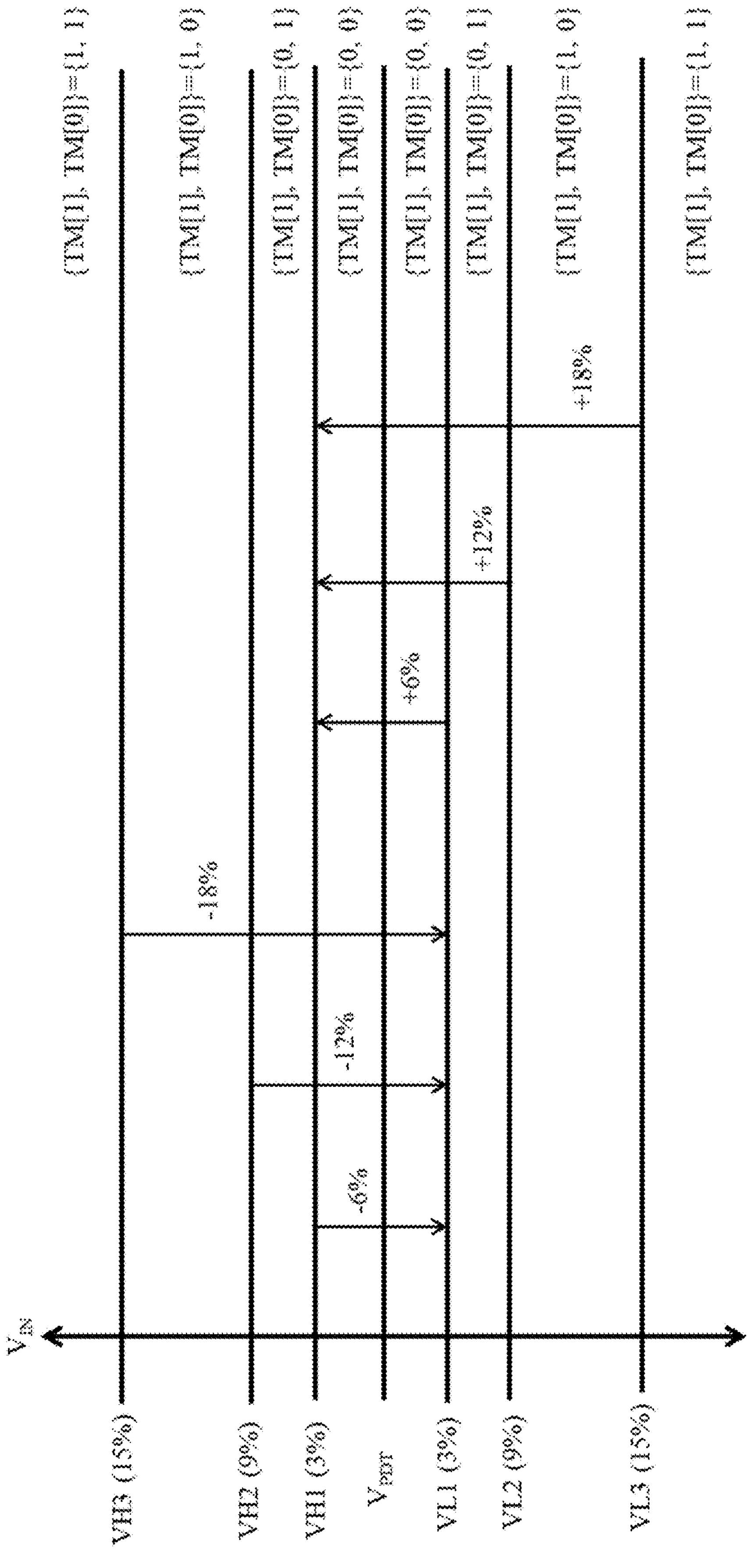
FIG. 8 illustrates an implementation of the reference voltages shown in FIG. 7 in accordance with some embodiments of the present disclosure.

FIG. 8 illustrates an implementation of the reference voltages VH1-VH3 and VL1-VL3 shown in FIG. 7 in accordance with some embodiments of the present disclosure. In the present embodiment, the input voltage $V_{IN}$ is substantially equal to the reference voltage $V_{PDT}$ when the equivalent impedance $Z_{C2}$ shown in FIG. 6 is equal to a nominal impedance. The input voltage $V_{IN}$ would reach the reference voltages VH1, VH2 and VH3 when the equivalent impedance $Z_{C2}$ shown in FIG. 6 falls below the nominal impedance by A %, B % and C % of the nominal impedance, respectively. The reference voltages VH1-VH3 may correspond to A %, B % and C % reductions in impedance compared to the nominal impedance, respectively. The input voltage $V_{IN}$ would reach the reference voltages VL1, VL2 and VL3 when the equivalent impedance $Z_{C2}$ shown in FIG. 6 exceeds the nominal impedance by A %, B % and C % of the nominal impedance, respectively. The reference voltages VL1-VL3 may correspond to A %, B % and C % increases in impedance compared to the nominal impedance, respectively.

In the example of FIG. 8, the reference voltages VH1-VH3 and VL1-VL3 can be set to appropriate levels such that A, B and C can be equal to 3, 9 and 15. However, those skilled in the art can appreciate that each reference voltage can be set to any appropriate level depending on design requirements without departing from the scope of the present disclosure.

Referring to FIG. 6, FIG. 7 and FIG. 8, in operation, the switch MR is turned on in response to assertion of the enable signal ZQ_E. The supply voltage VDDIO is applied to the impedance element $R_{REF}$ to generate the input voltage $V_{IN}$ which can reflect a change in the equivalent impedance $Z_{C2}$. The comparator 650 can generate the comparison result CR1 that is indicative of whether the input voltage $V_{IN}$ is greater than the predetermined reference voltage $V_{PDT}$. When comparison result CR1 indicates that the input voltage $V_{IN}$ is less than the predetermined reference voltage $V_{PDT}$, the variable impedance circuit 610 can enable each conduction path in the group of conduction paths GP1, and selectively enable at least one conduction path in the group of conduction paths GP2 according to the calibration code CC. Enabling one or more conduction paths in the group of conduction paths GP2 can compensate for the increase in impedance caused by PVT variations. When comparison result CR1 indicates that the input voltage $V_{IN}$ is greater than the predetermined reference voltage $V_{PDT}$, the variable impedance circuit 610 can disable each conduction path in the group of conduction paths GP2, and selectively disable at least one conduction path in the group of conduction paths GP1 according to the calibration code CC. Disabling one or more conduction paths in the group of conduction paths GP1 can compensate for the reduction in impedance caused by PVT variations.

In the present embodiment, when comparison result CR1 indicates that the input voltage $V_{IN}$ is less than the predetermined reference voltage $V_{PDT}$, each of the multiplexers 672_1-672_3 can output the input voltage $V_{IN}$, and the multiplexers 674_1-674_3 can output the reference voltages VL1-VL3, respectively. The comparators 676_1-676_3 can compare the input voltage $V_{IN}$ with the reference voltages VL1-VL3, respectively, to determine a deviation of the equivalent impedance $Z_{C2}$ from the nominal impedance (e.g. the impedance $Z_{REF}$ of the impedance element $R_{ZQ}$). The processing circuit 680 can generate the calibration code CC according to the comparison results CR21-CR23 outputted from the comparators 676_1-676_3. With the use of the calibration code CC indicative of a voltage range in which the input voltage $V_{IN}/V_{INF}$ falls, the variable impedance circuit 610 can enable/disable one or more conduction paths having different impedances to adaptively compensate for impedance changes caused by PVT variations.

For example, when the input voltage $V_{IN}$ is greater than the reference voltage VL1 and less than the predetermined reference voltage $V_{PDT}$, the equivalent impedance $Z_{C2}$ may exceed by the impedance $Z_{REF}$ by less than 3% of the impedance $Z_{REF}$. The variable impedance circuit 610 can enable the conduction paths PP[0]-PP[2], and disable the conduction paths PP[3] and PP[4]. In other words, the switches MP[0]-MP[2] are turned on, and the switches MP[3] and MP[4] are turned off. As a result, the equivalent impedance $Z_{C2}$ of the conduction paths PP[0]-PP[2] in parallel can serve as the impedance $Z_{IO}$, which lies within a tolerance range of a nominal impedance, e.g. a range of plus or minus 3% of the impedance $Z_{REF}$.

When the input voltage $V_{IN}$ is greater than the reference voltage VL2 and less than the reference voltage VL1, the equivalent impedance $Z_{C2}$ may exceed the impedance $Z_{REF}$ by 3% to 9% of the impedance $Z_{REF}$. To compensate for the increase in impedance caused by PVT variations, the variable impedance circuit 610 can enable the conduction path PP[3] to adjust an impedance presented between the supply terminal TD and the output terminal $PD_{OUT}$. For example, the switches MP[0]-MP[3] are turned on to enable the conduction paths PP[0]-PP[3], respectively. The switch MP[4] is turned off to disable the conduction path PP[4]. The resulting impedance $Z_{IO}$ can exhibit a decrease, such as 6% of the impedance $Z_{REF}$, compared to an impedance contributed by the conduction paths PP[0]-PP[2] in parallel. In other words, the variable impedance circuit 610 can enable the conduction path PP[3] to compensate for an increase in impedance, such as 6% of the impedance $Z_{REF}$.

When the input voltage $V_{IN}$ is greater than the reference voltage VL3 and less than the reference voltage VL2, the equivalent impedance $Z_{C2}$ may exceed the impedance $Z_{REF}$ by 9% to 15% of the impedance $Z_{REF}$. The variable impedance circuit 610 can enable the conduction path PP[4] to adjust an impedance presented between the supply terminal TD and the output terminal $PD_{OUT}$. The conduction path PP[4] can have an impedance different that of the conduction path PP[3]. For example, the switches MP[0]-MP[2] and MP[4] are turned on to enable the conduction paths PP[0]-PP[2] and PP[4], respectively. The switch MP[3] is turned off to disable the conduction path PP[3]. The resulting impedance $Z_{IO}$ can exhibit a decrease, such as 12% of the impedance $Z_{REF}$, compared to an impedance contributed by the conduction paths PP[0]-PP[2] in parallel. In other words, the variable impedance circuit 610 can enable the conduction path PP[4] to compensate for an increase in impedance, such as 12% of the impedance $Z_{REF}$.

When the input voltage $V_{IN}$ is less than the reference voltage VL3, the equivalent impedance $Z_{C2}$ may exceed the impedance $Z_{REF}$ by more than 15% of the impedance $Z_{REF}$. The variable impedance circuit 610 can enable both the conduction paths PP[3] and PP[4] to adjust an impedance presented between the supply terminal TD and the output terminal $PD_{OUT}$. For example, the switches MP[0]-MP[4] are turned on to enable the conduction paths PP[0]-PP[4], respectively. The resulting impedance $Z_{IO}$ can exhibit a decrease, such as 18% of the impedance $Z_{REF}$, compared to an impedance contributed by the conduction paths PP[0]-PP[2] in parallel. In other words, the variable impedance circuit 610 can enable both the conduction paths PP[3] and PP[4] to compensate for an increase in impedance, such as 18% of the impedance $Z_{REF}$.

Moreover, in the present embodiment, when comparison result CR1 indicates that the input voltage $V_{IN}$ is greater than the predetermined reference voltage $V_{PDT}$, the multiplexers 672_1-672_3 can output the reference voltages VH1-VH3, respectively, and each of the multiplexers 674_1-674_3 can output the input voltage $V_{IN}$. The comparators 676_1-676_3 can compare the input voltage $V_{IN}$ with the reference voltages VH1-VH3, respectively, to determine a deviation of the equivalent impedance $Z_{C2}$ from the nominal impedance (e.g. the impedance $Z_{REF}$ of the impedance element $R_{ZQ}$). The processing circuit 680 can generate the calibration code CC according to the comparison results CR21-CR23 outputted from the comparators 676_1-676_3. With the use of the calibration code CC, the variable impedance circuit 610 can provide the impedance $Z_{IO}$ that falls within a predetermined impedance range.

For example, when the input voltage $V_{IN}$ is greater than the predetermined reference voltage $V_{PDT}$ and less than the reference voltage VH1, the equivalent impedance $Z_{C2}$ may fall below the impedance $Z_{REF}$ by less than 3% of the impedance $Z_{REF}$. The variable impedance circuit 610 can enable the conduction paths PP[0]-PP[2], and disable the conduction paths PP[3] and PP[4]. In other words, the switches MP[0]-MP[2] are turned on, and the switches MP[3] and MP[4] are turned off. As a result, the equivalent impedance $Z_{C2}$ of the conduction paths PP[0]-PP[2] in parallel can serve as the impedance $Z_{IO}$, which lies within a tolerance range of a nominal impedance, e.g. a range of plus or minus 3% of the impedance $Z_{REF}$.

When the input voltage $V_{IN}$ is greater than the reference voltage VH1 and less than the reference voltage VH2, the equivalent impedance $Z_{C2}$ may fall below the impedance $Z_{REF}$ by 3% to 9% of the impedance $Z_{REF}$. To compensate for the reduction in impedance caused by PVT variations, the variable impedance circuit 610 can disable the conduction path PP[1] to adjust an impedance presented between the supply terminal TD and the output terminal $PD_{OUT}$. For example, the switches MP[0] and MP[2] are turned on to enable the conduction paths PP[0] and PP[2], respectively. The switches MP[1], MP[3] and MP[4] are turned off to disable the conduction paths PP[1], PP[3] and PP[4]. The resulting impedance $Z_{IO}$ can exhibit an increase, such as 6% of the impedance $Z_{REF}$, compared to an impedance contributed by the conduction paths PP[0]-PP[2] in parallel. In other words, the variable impedance circuit 610 can disable the conduction path PP[1] to compensate for a decrease in impedance, such as 6% of the impedance $Z_{REF}$.

When the input voltage $V_{IN}$ is greater than the reference voltage VH2 and less than the reference voltage VH3, the equivalent impedance $Z_{C2}$ may fall below the impedance $Z_{REF}$ by 9% to 15% of the impedance $Z_{REF}$. The variable impedance circuit 610 can disable the conduction path PP[2] to adjust an impedance presented between the supply terminal TD and the output terminal $PD_{OUT}$. The conduction path PP[2] can have an impedance different that of the conduction path PP[1]. For example, the switches MP[0] and MP[1] are turned on to enable the conduction paths PP[0] and PP[1], respectively. The switches MP[2]-MP[4] are turned off to disable the conduction paths PP[2]-PP[4]. The resulting impedance $Z_{IO}$ can exhibit an increase, such as 12% of the impedance $Z_{REF}$, compared to an impedance contributed by the conduction paths PP[0]-PP[2] in parallel. In other words, the variable impedance circuit 610 can disable the conduction path PP[2] to compensate for a decrease in impedance, such as 12% of the impedance $Z_{REF}$.

When the input voltage $V_{IN}$ is greater than the reference voltage VH3, the equivalent impedance $Z_{C2}$ may fall below the impedance $Z_{REF}$ by more than 15% of the impedance $Z_{REF}$. The variable impedance circuit 610 can disable both the conduction paths PP[1] and PP[2] to adjust an impedance presented between the supply terminal TD and the output terminal $PD_{OUT}$. For example, the switch MP[0] is turned on to enable the conduction path PP[0], and the switches MP[1]-MP[4] are turned off to disable the conduction paths PP[1]-PP[4]. The resulting impedance $Z_{IO}$ can exhibit an increase, such as 18% of the impedance $Z_{REF}$, compared to an impedance contributed by the conduction paths PP[0]-PP[2] in parallel. In other words, the variable impedance circuit 610 can disable both the conduction paths PP[1] and PP[2] to compensate for a decrease in impedance, such as 18% of the impedance $Z_{REF}$.

In the embodiment shown in FIG. 6, the impedance of the conduction path PP[i] can be equal to or substantially equal to the impedance of the conduction path PN[i], where i=0 to 4. For example, the impedance of the impedance element RP[i] can be substantially equal to the impedance of the impedance element RN[i]. The variable impedance circuit 610 can enable/disable one or more of the conduction paths PN[0]-PN[4] to adaptively compensate for impedance changes caused by PVT variations, thereby maintain an impedance presented between the supply terminal TS and the output terminal $PD_{OUT}$ to lie within a tolerance range of a nominal impedance, e.g. a range of plus or minus 3% of the impedance $Z_{REF}$. As those skilled in the art can appreciate the calibration operation associated with the conduction paths PN[0]-PN[4] after reading the above paragraphs directed to FIG. 1 to FIG. 8, similar description is omitted here for brevity.

The circuit structures described above are provided for illustrative purposes, and are not intended to limit the scope of the present disclosure. In some embodiments, the RC filter 332 shown in FIG. 4 or FIG. 7 may be optional. In some embodiments, the detection circuit 330 shown in FIG. 4 or FIG. 7 may be implemented using other circuit topologies as long as the generated input voltage $V_{IN}$ can reflect a change in impedance of the conduction paths included in the variable impedance circuit 310/610. In some embodiments, the frequency divider 390 shown in FIG. 4 or FIG. 7 may be optional.

In some embodiments, the detection path $CP_D$ shown in FIG. 4 or FIG. 7 may be implemented using other circuit structures, each of which is capable of tracking the effect of PVT variations on the output impedance characteristics. In some embodiments, the detection path $CP_D$ shown in FIG. 4 or FIG. 7 may have an impedance indicative of an impedance of one or more than three conduction paths as long as the impedance $Z_D$ can reflect a change in impedance caused by PVT variations. For example, the impedance $Z_D$ can be indicative of an impedance of the conduction path PP[0]. The impedance $Z_{REF}$ of the impedance element $R_{ZQ}$ can be equal to a nominal impedance of the conduction path PP[0].

In some embodiments, the comparison circuits 670_1-670_3 shown in FIG. 7 may be regarded as a selection stage 662 and a comparison stage 664. The selection stage 662 can be configured to select the one set of reference voltages from among the set of reference voltages {VH} and the set of reference voltages {VL} according to the comparison result CR1, and output the selected set of reference voltages. The comparison stage 664, coupled to the selection stage 662, can be configured to compare the input voltage $V_{IN}$ with each reference voltage in the selected one set of reference voltages to generate a set of comparison results, such as the comparison results CR21-CR23. Note that the selection stage 662 and/or the comparison stage 664 can be implemented using other circuit structures different from the circuit topology shown in FIG. 6. By way of example but not limitation, the selection stage 662 can be implemented using a 6-to-3 multiplexer circuit, and the comparison stage 664 can receive the input voltage $V_{INF}/V_{IN}$, and compare the received input voltage $V_{INF}/V_{IN}$ with an output of the 6-to-3 multiplexer circuit to generate the set of comparison results.

Figure 9:
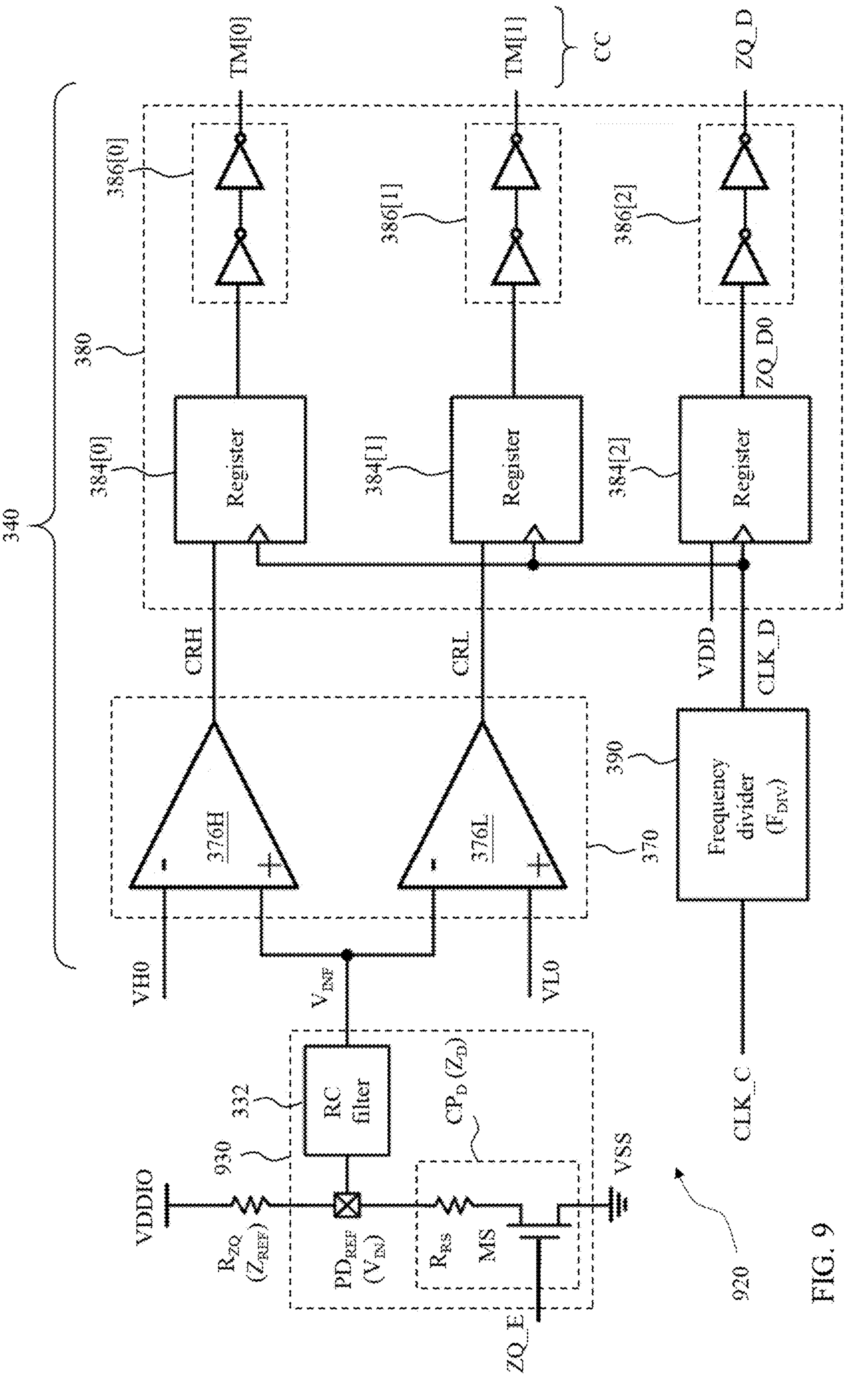
FIG. 9 illustrates an implementation of the calibration cell shown in FIG. 2C in accordance with some embodiments of the present disclosure.

In some embodiments, the calibration code CC outputted from the control circuit 340 shown in FIG. 4 can be generated based on the detection scheme shown in FIG. 2C. FIG. 9 illustrates an implementation of the calibration cell 220 shown in FIG. 2C in accordance with some embodiments of the present disclosure. The structure of the calibration cell 920 can be identical/similar to that of the calibration cell 320 shown in FIG. 4 except for the detection circuit 930. The detection circuit 930 can serve as an embodiment of the detection circuit 230 shown in FIG. 2C. The calibration cell 920 is operable with the variable impedance circuit 310 shown in FIG. 3 to realize an open loop calibration mechanism.

Referring to FIG. 9 and also to FIG. 3, the detection circuit 930 is arranged to apply the supply voltage VSS (having an electric potential equal to that of the supply voltage VSSIO coupled to the supply terminal TS) to the reference terminal $PD_{REF}$ through the detection path $CP_D$, thereby detecting a change in impedance of the conduction paths PN[0]-PN[2]. In the present embodiment, the impedance $Z_D$ can be indicative of an equivalent impedance of the conduction paths PN[0] and PN[1] in parallel. The detection path $CP_D$ may include a switch MS and an impedance element $R_{RS}$ connected in series, and can be used to track impedance characteristics of the conduction paths PN[0] and PN[1] in parallel. For example, the switch MS can be implemented using an n-channel transistor, which can be formed based on the size of the n-channel transistor used for implementing the switch MN[0]/MN[1]. The impedance element $R_{RS}$ can be formed based on the dimensions of the impedance elements RN[0] and RN[1].

With the use of the calibration code CC generated in response to the input voltage $V_{IN}/V_{INF}$, the variable impedance circuit 310 can adjust an equivalent impedance presented between the supply terminal TS and the output terminal $PD_{OUT}$ to fall within a predetermined impedance range. Additionally or alternatively, the variable impedance circuit 310 can be operable with the calibration cell 920 to adjust an equivalent impedance presented between the supply terminal TD and the output terminal $PD_{OUT}$ to fall within a predetermined impedance range. As those skilled in the art can understand the impedance calibration mechanism performed by the calibration cell 920 and the variable impedance circuit 310 after reading the above paragraphs directed to FIG. 1 to FIG. 8, similar description is omitted here for brevity.

Figure 10:
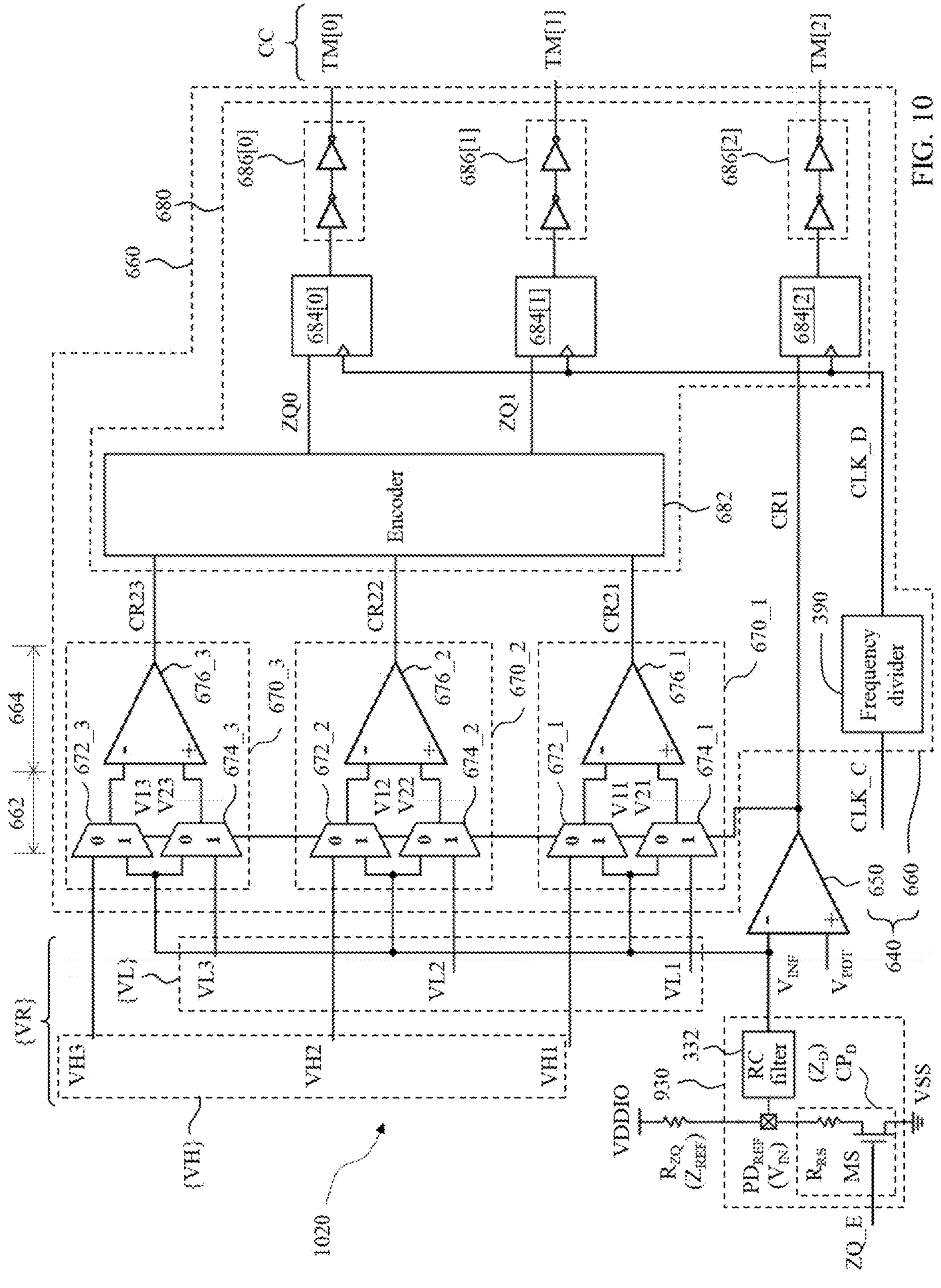
FIG. 10 illustrates an implementation of the calibration cell shown in FIG. 2C in accordance with some embodiments of the present disclosure.

In some embodiments, the calibration code CC outputted from the control circuit 640 shown in FIG. 7.can be generated based on the detection scheme shown in FIG. 2C. FIG. 10 illustrates an implementation of the calibration cell 220 shown in FIG. 2C in accordance with some embodiments of the present disclosure. The structure of the calibration cell 1020 can be identical/similar to that of the calibration cell 620 shown in FIG. 7 except for the detection circuit 930. The calibration cell 1020 is operable with the variable impedance circuit 610 shown in FIG. 6 to realize an open loop calibration mechanism.

Referring to FIG. 10 and also to FIG. 6, the detection circuit 930 is arranged to apply the supply voltage VSS (having an electric potential equal to that of the supply voltage VSSIO coupled to the supply terminal TS) to the reference terminal $PD_{REF}$ through the detection path $CP_D$, thereby detecting a change in impedance of the conduction paths PN[0]-PN[4]. In the present embodiment, the impedance $Z_D$ can be indicative of an equivalent impedance of the conduction paths PN[0]-PN[2] in parallel. The detection path $CP_D$ can be used to track impedance characteristics of the conduction paths PN[0]-PN[2] in parallel. For example, the switch MS can be implemented using an n-channel transistor, which can be formed based on the size of the n-channel transistor used for implementing the switch MN[0]/MN[1]/MN[2]. The impedance element $R_{RS}$ can be formed based on the dimensions of the impedance elements RN[0]-RN[2].

With the use of the calibration code CC generated in response to the input voltage $V_{IN}/V_{INF}$, the variable impedance circuit 610 can adjust an equivalent impedance presented between the supply terminal TS and the output terminal $PD_{OUT}$ to fall within a predetermined impedance range. Additionally or alternatively, the variable impedance circuit 610 can be operable with the calibration cell 1020 to adjust an equivalent impedance presented between the supply terminal TD and the output terminal $PD_{OUT}$ to fall within a predetermined impedance range. As those skilled in the art can understand the impedance calibration mechanism performed by the calibration cell 1020 and the variable impedance circuit 610 after reading the above paragraphs directed to FIG. 1 to FIG. 9, similar description is omitted here for brevity.

With the use of a detection circuit capable of tracking impedance characteristics affected by PVT variations, the proposed impedance calibration circuit can realize an open loop calibration mechanism, and achieve a simplified structure and faster response. In addition, the proposed impedance calibration circuit can compare a voltage indicative of impedance variations with a selected set of reference voltages and accordingly enable/disable one or more conduction paths having different impedances, thereby realizing adaptive impedance compensation with high precision. For example, the impedance calibration circuit shown in FIG. 6 may maintain the impedance $Z_{IO}$ to lie within a range of plus or minus 3% of a nominal impedance.

Figure 11:
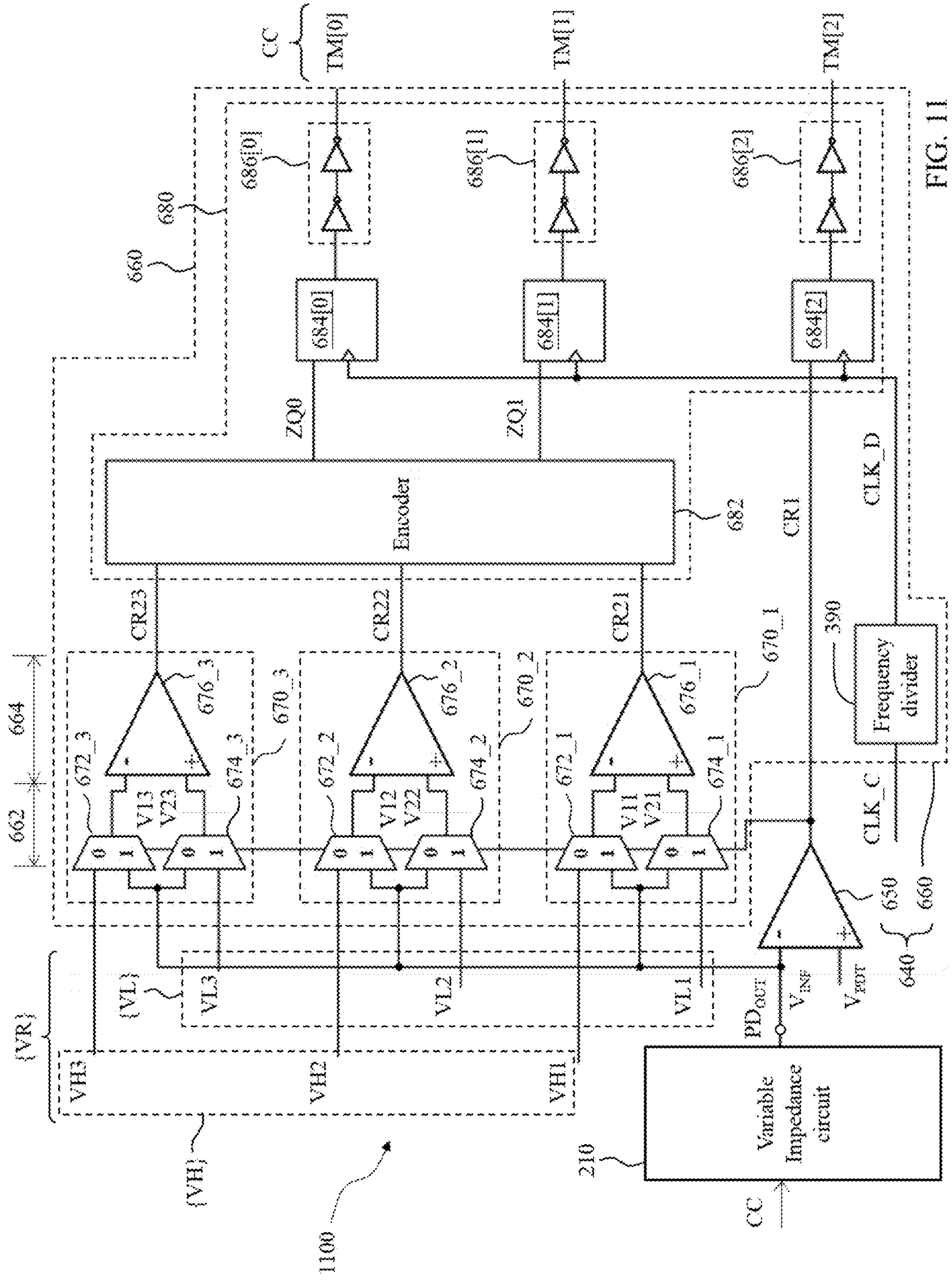
FIG. 11 illustrates an implementation of the impedance calibration circuit shown in FIG. 1 in accordance with some embodiments of the present disclosure.

In some embodiments, the proposed adaptive impedance compensation with high precision can be applied to an impedance calibration circuit utilizing closed loop control. FIG. 11 illustrates an implementation of the impedance calibration circuit 100 shown in FIG. 1 in accordance with some embodiments of the present disclosure. In the present embodiment, the impedance calibration circuit 1100 may include the variable impedance circuit 210 shown in FIG. 2A and the control circuit 640 shown in FIG. 6. The input voltage $V_{INF}$ inputted to the control circuit 640 may come from the variable impedance circuit 210.

By way of example but not limitation, in operation, the control circuit 640 can compare a voltage occurring at the output terminal $PD_{OUT}$, i.e. the input voltage $V_{INF}$, with the plurality of reference voltages {VR} to generate/update the trim bits TM[0]-TM[2]. The generated/updated trim bits TM[0]-TM[2], i.e. the generated/updated calibration code CC, can be fed back to the variable impedance circuit 210 for impedance compensation. As those skilled in the art can understand the operation of the impedance calibration circuit 1100 after reading the above paragraphs directed to FIG. 1 to FIG. 10, further description is omitted here for brevity. In addition, those skilled in the art can appreciate that the control circuit 340 shown in FIG. 4, the control circuit 340 shown in FIG. 9 and the control circuit 640 shown in FIG. 10 can be applied to an impedance calibration circuit utilizing closed loop control without departing from the scope of the present disclosure.

Figure 12:
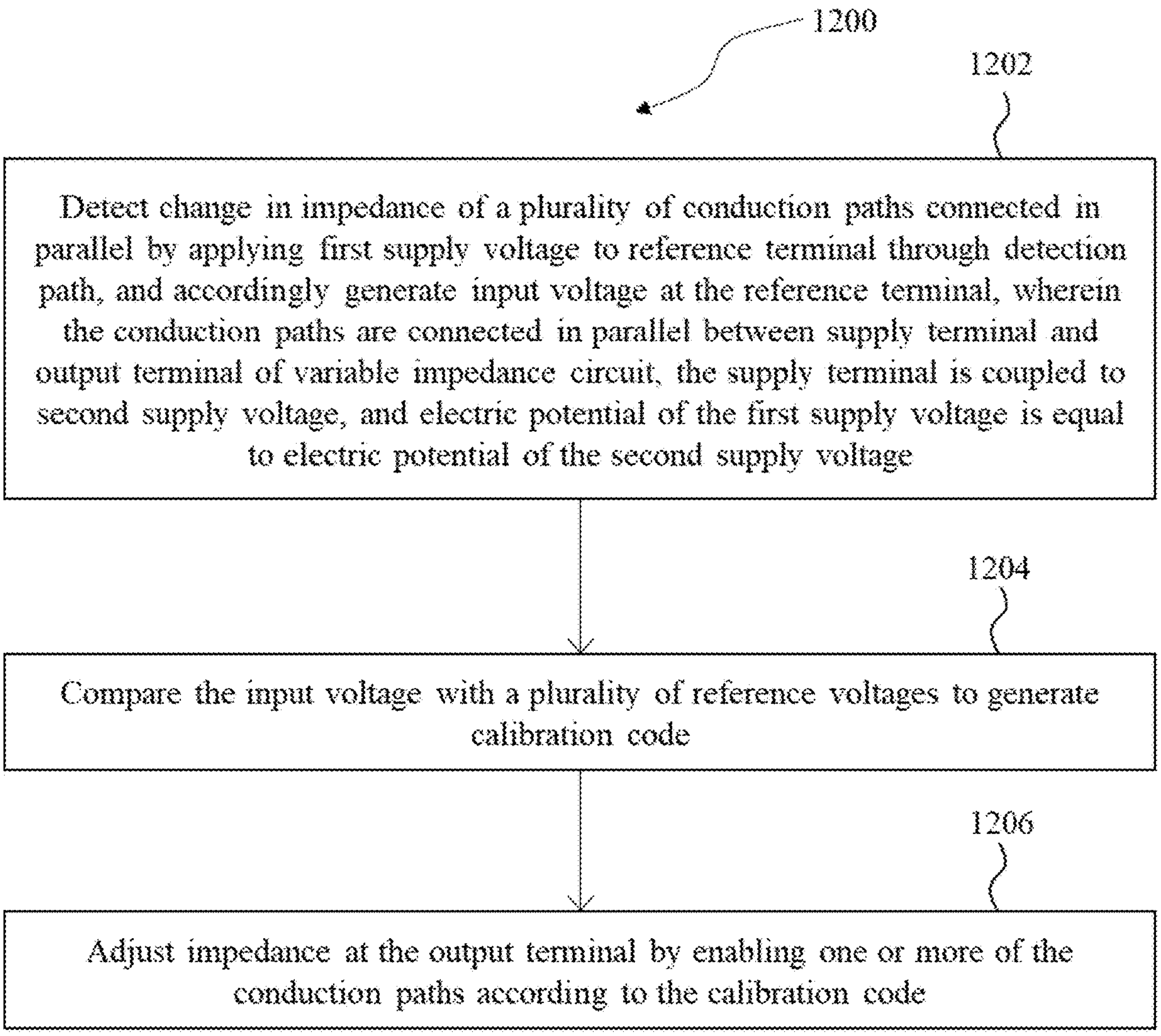
FIG. 12 is a flow chart of an exemplary impedance calibration method in accordance with some embodiments of the present disclosure.

FIG. 12 is a flow chart of an exemplary impedance calibration method in accordance with some embodiments of the present disclosure. The impedance calibration method 1200 is described with reference to the variable impedance circuit 610 shown in FIG. 6 and the calibration cell 620 shown in FIG. 7 for illustrative purposes. Those skilled in the art should appreciate that the impedance calibration method 1200 can be employed in the impedance calibration circuit 100 shown in FIG. 1, the impedance calibration circuit 200A shown in FIG. 2A, the impedance calibration circuit 200B shown in FIG. 2B, the impedance calibration circuit 200C shown in FIG. 2C, an impedance calibration circuit including the variable impedance circuit 310 shown in FIG. 3 and the calibration cell 320 shown in FIG. 4 (or FIG. 9), and an impedance calibration circuit including the variable impedance circuit 610 shown in FIG. 6 and the calibration cell 1020 shown in FIG. 10 without departing from the scope of the present disclosure. Additionally, in some embodiments, other operations in the impedance calibration method 1200 can be performed. In some embodiments, operations of the impedance calibration method 1200 can vary.

At operation 1202, a first supply voltage is applied to a reference terminal through a detection path to detect a change in impedance of a plurality of conduction paths connected in parallel. An input voltage at the reference terminal is generated accordingly. The conduction paths are connected in parallel between a supply terminal and an output terminal of a variable impedance circuit. The supply terminal is coupled to a second supply voltage, and an electric potential of the first supply voltage is equal to an electric potential of the second supply voltage. For example, the detection circuit 330 can detect a change in impedance of the conduction paths PP[0]-PP[4] connected in parallel by applying the supply voltage VDDIO to the reference terminal $PD_{REF}$ through the detection path $CP_D$, and accordingly generate the input voltage $V_{IN}$ at the reference terminal $PD_{REF}$.

At operation 1204, the input voltage is compared with a plurality of reference voltages to generate a calibration code. For example, the control circuit 640 can compare the input voltage $V_{IN}$ with a plurality of reference voltages, which include the predetermined reference voltage $V_{PDT}$, the set of reference voltages {VH} and the set of reference voltages {VL}, and accordingly generate the calibration code CC including the trim bits TM[0]-TM[2].

At operation 1206, an impedance at the output terminal is adjusted by enabling one or more of the conduction paths according to the calibration code. For example, the variable impedance circuit 610 can adjust the impedance $Z_{IO}$ by enabling one or more of the conduction paths PP[0]-PP[4] according to the trim bits TM[0]-TM[2].

In some embodiments, the conduction paths connected in parallel may include a conduction path, a first group of conduction paths and a second group of conduction paths. The impedance of the detection path can be indicative of an equivalent impedance of the conduction path and the first group of conduction paths. When the input voltage is less than a minimum voltage of the reference voltages, each conduction path in the first group of conduction paths is enabled, and each conduction path in the second group of conduction paths is enabled. When the input voltage is greater a maximum voltage of the reference voltages, each conduction path in the first group of conduction paths is disabled, and each conduction path in the second group of conduction paths is disabled.

For example, the conduction paths PP[0]-PP[4] may be divided into the conduction path PP[0], a group of conduction paths GP1 and a group of conduction paths GP2. The group of conduction paths GP1 includes the conduction paths PP[1] and PP[2]. The group of conduction paths GP2 includes the conduction paths PP[3] and PP[4]. When the input voltage $V_{IN}$ is less than the reference voltage VL3, the variable impedance circuit 610 can enable each of the conduction paths PP[1]-PP[4] to compensate for an increase in impedance. When the input voltage $V_{IN}$ is greater than the reference voltage VH3, the variable impedance circuit 610 can disable each of the conduction paths PP[1]-PP[4] to compensate for a reduction in impedance.

As those skilled in the art can appreciate operation of the impedance calibration method 1200 after reading the above paragraphs directed to FIG. 1 through FIG. 11, further description is omitted here for brevity.

As used herein, the terms "substantially" are used to describe and account for small variations. When used in conduction with an event or circumstance, the terms can refer to instances in which the event of circumstance occurs precisely as well as instances in which the event or circumstance occurs to a close approximation. As used herein with respect to ta given value or range, the term "substantially" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. In addition, when referring to numerical values or characteristics as "substantially" the same, the term can refer to the values lying within ±10%, ±5%, ±1%, or ±0.5% of an average of the values.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An impedance calibration circuit, comprising:

a variable impedance circuit, comprising a plurality of conduction paths connected in parallel, each of the conduction paths being coupled to an output terminal, the variable impedance circuit being configured to adjust an impedance at the output terminal by enabling one or more of the conduction paths according to a calibration code;

a first comparator, coupled to the output terminal of the variable impedance circuit, the first comparator being configured to compare a voltage at the output terminal with a predetermined reference voltage to generate a first comparison result, the first comparison result serving as a first portion of the calibration code; and a signal generator circuit, coupled to the variable impedance circuit and the first comparator, the signal generator circuit being configured to compare the voltage with one set of reference voltages selected from among a first set of reference voltages and a second set of reference voltages according to the first comparison result, and accordingly generate a second portion of the calibration code, wherein the first set of reference voltages is different from the second set of reference voltages.

2. The impedance calibration circuit of claim 1, wherein each reference voltage in the first set of reference voltages is greater than the predetermined reference voltage, and each reference voltage in the second set of reference voltages is less than the predetermined reference voltage.

3. The impedance calibration circuit of claim 1, wherein:

the conduction paths comprise a conduction path, a first group of conduction paths and a second group of conductive paths; the conductive path and each conduction path in the first group of conduction paths are enabled;

when the first comparison result indicates that the voltage is less than the predetermined reference voltage, the variable impedance circuit is configured to selectively enable at least one conduction path in the second group of conduction paths according to the calibration code; and when the first comparison result indicates that the voltage is greater than the predetermined reference voltage, the variable impedance circuit is configured to disable each conduction path in the second group of conduction paths, and selectively disable at least one conduction path in the first group of conduction paths according to the calibration code.

4. The impedance calibration circuit of claim 1, wherein:

the conduction paths comprise a first conduction path and a second conduction path, and an impedance of the first conduction path is different from an impedance of the second conduction path;

the selected set of reference voltages comprises a first reference voltage, a second reference voltage and a third reference voltage; the second reference voltage is greater than the first reference voltage, and less than the third reference voltage; and when the voltage is between the first reference voltage and the second reference voltage, the variable impedance circuit is configured to disable the first conduction path and enable the second conduction path; when the voltage is between the second reference voltage and the third reference voltage, the variable impedance circuit is configured to enable the first conduction path and disable the second conduction path.

5. The impedance calibration circuit of claim 4, wherein when the voltage is greater than the third reference voltage, the variable impedance circuit is configured to disable the first conduction path and the second conduction path.

6. The impedance calibration circuit of claim 4, wherein when the voltage is less than the first reference voltage, the variable impedance circuit is configured to enable the first conduction path and the second conduction path.

7. The impedance calibration circuit of claim 1, wherein the signal generator circuit comprises:

N comparison circuits, coupled to N reference voltages in the first set of reference voltages respectively and coupled to N reference voltages in the second set of reference voltages respectively, N being an integer greater than one, wherein each comparison circuit is configured to compare the voltage with a corresponding reference voltage in the selected set of reference voltages, and accordingly generate a second comparison result; and a processing circuit, coupled to the N comparison circuits, the processing circuit being configured to process the N second comparison results to generate the second portion of the calibration code.

8. The impedance calibration circuit of claim 7, wherein the comparison circuit comprises:

a first multiplexer, configured to output one of the voltage and a corresponding reference voltage in the first set of reference voltages as a first voltage according to the first comparison result;

a second multiplexer, configured to output one of the voltage and a corresponding reference voltage in the second set of reference voltages as a second voltage according to the first comparison result; and a second comparator, coupled to the first multiplexer and the second multiplexer, the second comparator being configured to compare the first voltage with the second voltage to generate the second comparison result;

wherein when the first multiplexer is configured to output the reference voltage in the first set of reference voltages as the first voltage, the second multiplexer is configured to output the voltage as the second voltage; when the first multiplexer is configured to output the voltage as the first voltage, the second multiplexer is configured to the reference voltage in the second set of reference voltages as the second voltage.

9. The impedance calibration circuit of claim 1, wherein the signal generator circuit comprises:

a selection stage, configured to select the one set of reference voltages from among the first set of reference voltages and the second set of reference voltages according to the first comparison result, and output the selected set of reference voltages;

a comparison stage, coupled to the selection stage, the comparison stage being configured to compare the voltage with each reference voltage in the selected one set of reference voltages to generate a set of second comparison results; and a processing circuit, coupled to the comparison stage, the processing circuit being configured to process the set of second comparison results to generate the second portion of the calibration code.

10. The impedance calibration circuit of claim 1, wherein:

the conduction paths comprise a conduction path, a first group of conduction paths and a second group of conduction paths;

when the voltage is less than a minimum voltage of the reference voltages, the variable impedance circuit is configured to enable the conductive path, each conduction path in the first group of conduction paths, and each conduction path in the second group of conduction paths; and when the voltage is greater than a maximum voltage of the reference voltages, the variable impedance circuit is configured to enable the conductive path, disable each conduction path in the first group of conduction paths, and disable each conduction path in the second group of conduction paths.

11. The impedance calibration circuit of claim 1, wherein respective voltage differences between the predetermined reference voltage and each reference voltage in the first set of reference voltages are equal in magnitude to respective voltage differences between the predetermined reference voltage and each reference voltage in the second set of reference voltages.

12. An impedance calibration method, comprising:

applying a supply voltage to a supply terminal of a variable impedance circuit, wherein a plurality of conduction paths are connected in parallel between the supply terminal and an output terminal of the variable impedance circuit;

comparing a voltage at the output terminal with a predetermined reference voltage to generate a first comparison result, the first comparison result serving as a first portion of a calibration code;

generating a second portion of the calibration code by comparing the voltage with one set of reference voltages selected from among a first set of reference voltages and a second set of reference voltages according to the first comparison result; and adjusting an impedance at the output terminal by enabling one or more of the conduction paths according to the calibration code.

13. The impedance calibration method of claim 12, wherein each reference voltage in the first set of reference voltages is greater than the predetermined reference voltage, and each reference voltage in the second set of reference voltages is less than the predetermined reference voltage.

14. The impedance calibration method of claim 12, wherein the conduction paths comprise a conduction path, a first group of conduction paths and a second group of conductive paths; the conductive path and each conduction path in the first group of conduction paths are enabled; the step of adjusting the impedance at the output terminal by enabling one or more of the conduction paths according to the calibration code comprises:

when the first comparison result indicates that the voltage is less than the predetermined reference voltage, selectively enabling at least one conduction path in the second group of conduction paths according to the calibration code; and when the first comparison result indicates that the voltage is greater than the predetermined reference voltage, disabling each conduction path in the second group of conduction paths, and selectively disabling at least one conduction path in the first group of conduction paths according to the calibration code.

15. The impedance calibration method of claim 12, wherein the conduction paths comprise a first conduction path and a second conduction path, and an impedance of the first conduction path is different from an impedance of the second conduction path; the selected set of reference voltages comprises a first reference voltage, a second reference voltage and a third reference voltage; the second reference voltage is greater than the first reference voltage, and less than the third reference voltage; the step of adjusting the impedance at the output terminal by enabling one or more of the conduction paths according to the calibration code comprises:

when the voltage is between the first reference voltage and the second reference voltage, disabling the first conduction path, and enabling the second conduction path; and when the voltage is between the second reference voltage and the third reference voltage, enabling the first conduction path, and disabling the second conduction path.

16. The impedance calibration method of claim 15, wherein the step of adjusting the impedance at the output terminal by enabling one or more of the conduction paths according to the calibration code further comprises:

when the voltage is greater than the third reference voltage, disabling the first conduction path and the second conduction path.

17. The impedance calibration method of claim 15, wherein the step of adjusting the impedance at the output terminal by enabling one or more of the conduction paths according to the calibration code further comprises:

when the voltage is less than the first reference voltage, enabling the first conduction path and the second conduction path.

18. The impedance calibration method of claim 12, wherein the first set of reference voltages comprises N reference voltages, the second set of reference voltages comprises N reference voltages, and Nis an integer greater than one; the step of generating a second portion of the calibration code by comparing the voltage with one set of reference voltages selected from among a first set of reference voltages and a second set of reference voltages according to the first comparison result comprises:

comparing the voltage with the N reference voltages in the selected set of reference voltages to generate N second comparison results, respectively; and processing the N second comparison results to generate the second portion of the calibration code.

19. The impedance calibration method of claim 12, wherein the step of generating the second portion of the calibration code by comparing the voltage with one set of reference voltages selected from among the first set of reference voltages and the second set of reference voltages according to the first comparison result comprises:

selecting one set of reference voltages from among the first set of reference voltages and the second set of reference voltages according to the first comparison result; and comparing the voltage with each reference voltage in the selected set of reference voltages to generate the second portion of the calibration code.

20. The impedance calibration method of claim 12, wherein the conduction paths comprise a conduction path, a first group of conduction paths and a second group of conduction paths; the step of adjusting the impedance at the output terminal by enabling one or more of the conduction paths according to the calibration code comprises:

when the voltage is less than a minimum voltage of the reference voltages, enabling the conductive path, each conduction path in the first group of conduction paths, and each conduction path in the second group of conduction paths; and when the voltage is greater than a maximum voltage of the reference voltages, enabling the conductive path, disabling each conduction path in the first group of conduction paths, and disabling each conduction path in the second group of conduction paths.

* * * * *